(12) United States Patent  
Brodsky et al.

(10) Patent No.: US 7,076,333 B2
(45) Date of Patent: Jul. 11, 2006

(54) RELEASABLE, REPEATABLE ELECTRICAL CONNECTION EMPLOYING COMPRESSION

(75) Inventors: William Louis Brodsky, Binghamton, NY (US); Dennis Hurley Byrne, Tucson, AZ (US); Alex Chliwnyj, Tucson, AZ (US); David Michael Davis, Tucson, AZ (US); James Mitchell Karp, Tucson, AZ (US); George G. Zamora, Vail, AZ (US)

(73) Assignee: Quantum Corporation, San Jose, CA (US)

( * ) Notice: Subject to any disclaimer, the term of this patent is extended or adjusted under 35 U.S.C. 154(b) by 33 days.

(21) Appl. No.: 10/947,795

(22) Filed: Sep. 24, 2004

(65) Prior Publication Data

US 2005/0037654 A1    Feb. 17, 2005

Related U.S. Application Data

(60) Continuation of application No. 10/336,510, filed on Jan. 6, 2003, now Pat. No. 6,837,718, which is a division of application No. 09/842,029, filed on Apr. 26, 2001, now Pat. No. 6,540,528.

(51) Int. Cl.
*G06F 19/00*    (2006.01)

(52) U.S. Cl. ............... 700/245; 700/162; 700/197; 700/200; 700/214; 700/215; 700/218; 700/255; 414/277; 414/281; 901/1; 901/8; 901/42; 901/50

(58) Field of Classification Search ............ 700/245, 700/162, 197, 200, 214–218, 255; 414/277, 414/281; 901/1, 8, 42, 50; 711/161; 104/88.02
See application file for complete search history.

(56) References Cited

U.S. PATENT DOCUMENTS

| 4,895,523 A | 1/1990 | Morrison et al. ............ 439/67 |
| 4,902,234 A | 2/1990 | Brodsky et al. ............. 439/67 |
| 5,026,291 A | 6/1991 | David ....................... 439/67 |
| 5,059,129 A | 10/1991 | Brodsky et al. ............. 439/67 |

(Continued)

FOREIGN PATENT DOCUMENTS

JP    7220464    8/1995

OTHER PUBLICATIONS

Quantum ATL, Quantum|ATL 7100 Series Library Operator's Guide, Ver. 2, Rel. 2, 1997, Inter, i-62.*

*Primary Examiner*—Thomas G. Black
*Assistant Examiner*—McDieunel Marc
(74) *Attorney, Agent, or Firm*—Mark J. Spolyar

(57) ABSTRACT

An electrical connection of a transfer station releasably, repeatably electrically couples with respect to a matching connection of a portable cartridge. A substrate in the portable cartridge has electrical contacts on a facing surface. In the transfer station, a matching circuitized flexible substrate has electrical contacts on a facing surface thereof, which are arranged to match the portable cartridge electrical contacts when in a face-to-face relationship. An elastomeric compression element, at the rear of the matching substrate, has individual protruding compression members contacting the rear surface and registered with corresponding individual electrical contacts. Elongated electrical contacts are registered with two adjacent individual compression members. A loader engages the portable cartridge, registering the cartridge substrate contacts in face-to-face relation with the matching flexible substrate electrical contacts, and exerting a normal force to the cartridge to compress the compression element and create non-wiping contact between the facing electrical contacts.

19 Claims, 21 Drawing Sheets

U.S. PATENT DOCUMENTS

| | | |
|---|---|---|
| 5,123,852 A | 6/1992 | Gillett .......................... 439/67 |
| 5,133,667 A | 7/1992 | Daughtrey ................... 439/67 |
| RE34,369 E | 9/1993 | Darden et al. .............. 439/377 |
| 5,273,440 A | 12/1993 | Ashman et al. ............... 439/67 |
| 5,306,162 A | 4/1994 | Armendariz ................. 439/67 |
| 5,336,095 A | 8/1994 | Walburn et al. .............. 439/67 |
| 5,444,586 A | 8/1995 | Iftikar et al. ............. 360/99.12 |
| 5,505,626 A | 4/1996 | Grabbe et al. ................ 439/67 |
| 5,873,740 A | 2/1999 | Alcoe et al. .................. 439/67 |
| 5,947,750 A | 9/1999 | Alcoe et al. .................. 439/67 |
| 5,970,030 A | 10/1999 | Dimitri et al. ................ 369/36 |
| 6,024,580 A | 2/2000 | Dangler et al. ............... 439/67 |
| 6,086,412 A | 7/2000 | Watt et al. .................. 439/496 |
| 6,368,117 B1 | 4/2002 | Taylor .......................... 439/67 |
| 6,636,942 B1* | 10/2003 | Greco ........................ 711/112 |
| 6,668,991 B1* | 12/2003 | Ostwald et al. ................. 191/2 |
| 6,690,539 B1* | 2/2004 | Gallo et al. .............. 360/97.01 |
| 6,722,895 B1* | 4/2004 | Brodsky et al. ............... 439/67 |
| 6,751,048 B1* | 6/2004 | Ostwald et al. ................ 360/92 |
| 6,771,448 B1* | 8/2004 | Blair et al. .................. 360/69 |
| 6,798,612 B1* | 9/2004 | Smith et al. .................. 360/92 |
| 6,810,306 B1* | 10/2004 | Ostwald ..................... 700/245 |
| 6,826,004 B1* | 11/2004 | Albrecht et al. .............. 360/69 |
| 6,885,911 B1* | 4/2005 | Smith ......................... 700/245 |
| 6,895,300 B1* | 5/2005 | Goodman et al. .......... 700/213 |

\* cited by examiner

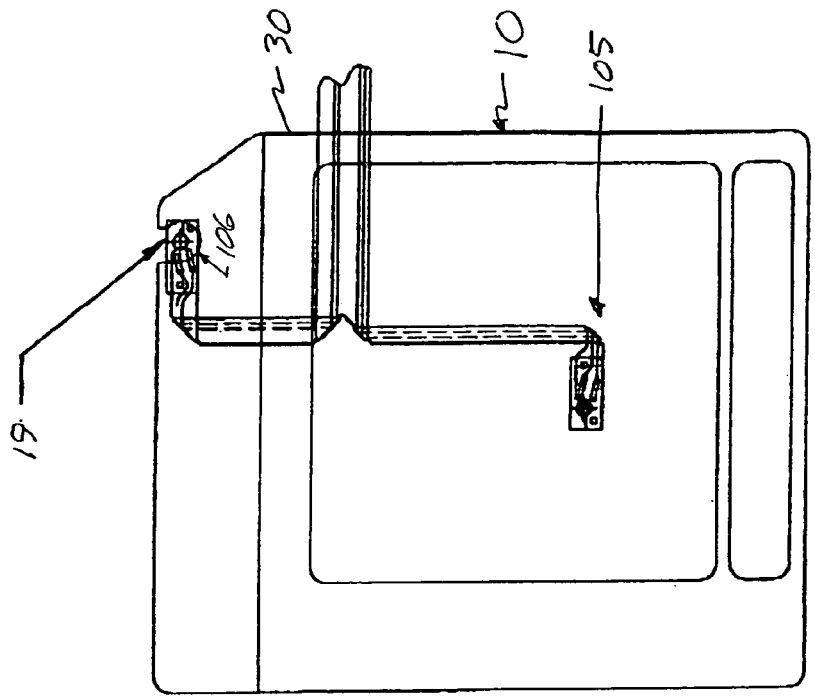
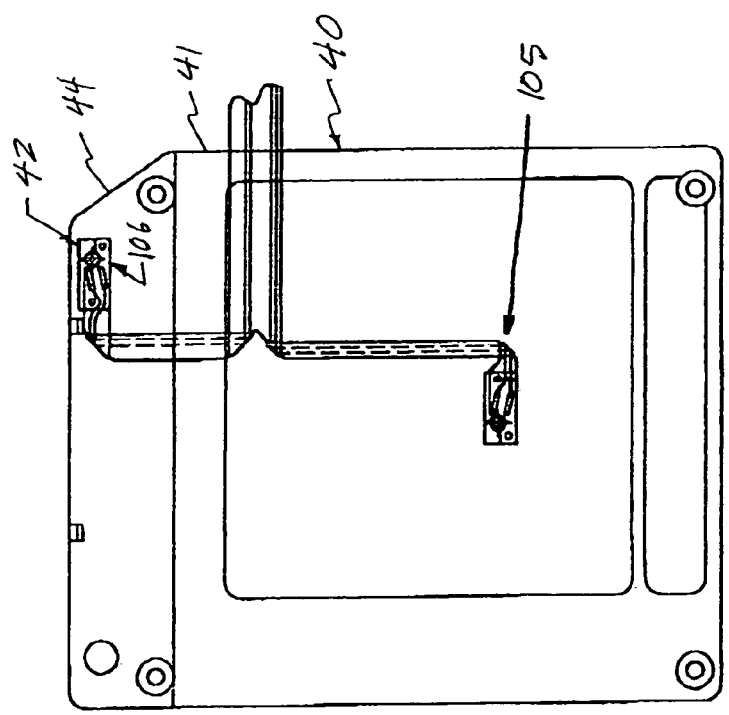

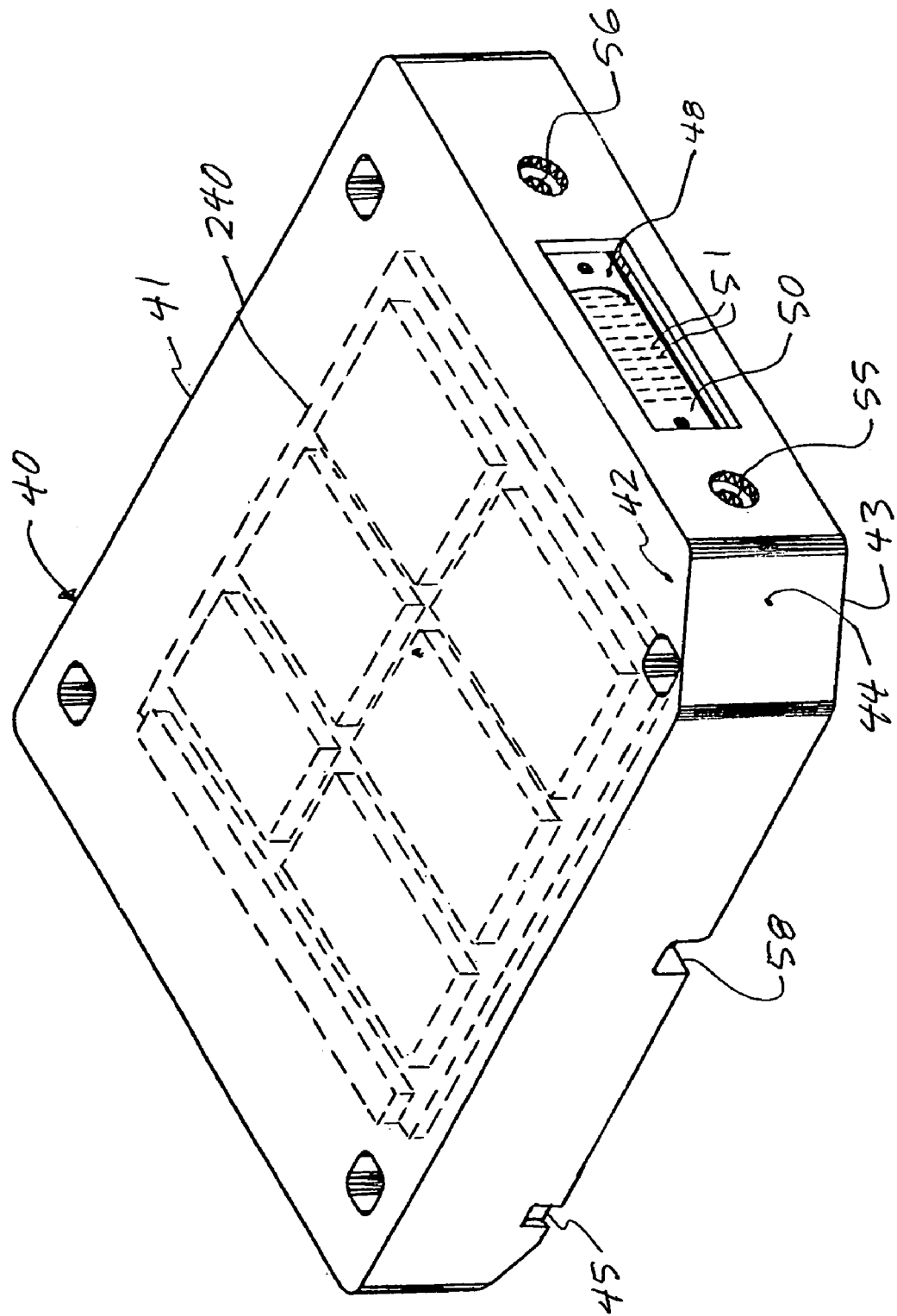

RELEASABLE, REPEATABLE ELECTRICAL CONNECTION EMPLOYING COMPRESSION

REFERENCE TO RELATED APPLICATIONS

This application comprises a continuation of application Ser. No. 10/336,510, filed Jan. 6, 2003, now U.S. Pat. No. 6,837,718, which is a divisional of application Ser. No. 09/842,029, filed Apr. 26, 2001, now U.S. Pat. No. 6,540,528.

Copending and coassigned U. S. patent application Ser. No. 09/842,030 filed on Apr. 26, 2001, relates to alternative media devices mounted in portable data storage type cartridges, and a transfer station for providing data transfer with respect to such portable data storage cartridges.

TECHNICAL FIELD OF THE INVENTION

This invention relates to electrical interconnection apparatus, and, more particularly, to electrical interconnection apparatus for the transfer of data to and from a portable agent, and for the transfer of low voltage power.

BACKGROUND OF THE INVENTION

Data storage cartridges typically comprise a data storage media, such as magnetic tape, which are inserted into a separate data storage drive so that data may be read and/or written on the data storage media. Such cartridges are convenient means of storing large quantities of data which are accessed occasionally. They are particularly useful in automated data storage libraries which can contain large numbers of the cartridges on storage shelves and employ a robot accessor to access a cartridge when needed and deliver the cartridge to a data storage drive.

The typical portable cartridge presently employs a data storage media, such as a length of magnetic tape, which must be open or openable when inserted in a fixed data storage drive to allow the data storage drive to read and/or write data on the media.

An inhibitor to the use of any direct data transfer to portable cartridges, instead of to the media which is stored in the cartridge, has been the problem of the interconnection. Detachable data storage devices are known, for example, in U.S. Pat. No. Re. 34,369, or Japanese Patent 7-220464, which employ pluggable connectors. Pluggable connectors typically employ pins and receptacles which wipe against each other as they are plugged and unplugged, thereby cleaning the connectors. However, the wiping action also limits the ability to unplug and replug the connectors, often to 10–15 times, thereby preventing their use for portable cartridges. U.S. Pat. No. 5,970,030 shows that data storage drives may be exchanged, employing low insertion force connectors which require a complex connect/disconnect mechanism. Such connectors are not practical for portable cartridges.

SUMMARY OF THE INVENTION

Hence, an object of the present invention is to provide an electrical connection allowing direct data transfer to portable cartridges.

Another object of the present invention is to provide an electrical connection which is releasable, and which connection is repeatable.

A transfer station is provided for releasably, repeatably electrically coupling with respect to a portable cartridge. A substrate is mounted in the portable cartridge, the substrate having a plurality of electrical contacts on a facing surface thereof, and the portable cartridge is capable of being engaged by a loader. In the transfer station, a matching circuitized flexible substrate is provided having electrical contacts on a facing surface thereof, the electrical contacts-arranged to match the portable cartridge electrical contacts when in a face-to-face relationship. An elastomeric compression element, which has a plurality of protruding compression members, is positioned at a rear surface of the matching circuitized flexible substrate with the protruding compression members facing and in contact with the rear surface, such that individual compression members are registered with corresponding individual electrical contacts. Elongated electrical contacts are registered with two adjacent individual compression members. A reference plate supports the elastomeric compression element. A loader engages the portable cartridge, registering the cartridge substrate electrical contacts in face-to-face relation with the matching circuitized flexible substrate electrical contacts, and exerting a force on the portable cartridge normal to the facing surface of the matching circuitized flexible substrate. The normal force causes the portable cartridge substrate to compress the elastomeric compression element between the matching circuitized flexible substrate and the reference plate to create-non-wiping contact between the electrical contacts of the portable cartridge substrate and the electrical contacts of the matching circuitized flexible substrate, thereby forming a releasable, repeatable electrical connection therebetween.

A portable cartridge is provided for mating with a transfer station having a data transfer interface with electrical contacts on a compression element and having a cartridge loader. The cartridge comprises a data handling agent, such as an encased, self-contained, magnetic data storage drive. In accordance with the present invention, the cartridge comprises a substantially flat substrate having electrical contacts on a facing surface thereof, the electrical contacts arranged to match the transfer station data transfer interface electrical contacts when in a face-to-face relationship. The substantially flat substrate is coupled to the data handling agent. A cartridge shell supports the data handling agent and the substantially flat substrate. The cartridge shell has at least one engagement surface, such as notches and alignment holes, for engagement by the cartridge loader in the transfer station, whereby the cartridge loader may engage the cartridge, register the cartridge electrical contacts in face-to-face relation with the transfer station data transfer interface electrical contacts, and exert a force on the cartridge normal to the facing surface of the transfer station data transfer interface to cause the portable cartridge substrate to compress the compression element to create non-wiping contact between the electrical contacts of the portable cartridge substrate and the transfer station data transfer interface facing surface, and forming a releasable, repeatable electrical connection therebetween.

For a fuller understanding of the present invention, reference should be made to the following detailed description taken in conjunction with the accompanying drawings.

BRIEF DESCRIPTION OF THE DRAWINGS

FIGS. 11A and 11A are top view illustrations of an optical source mounted on a top plate of the transfer station of FIG. 10 for detecting, respectively, the portable data storage cartridge of FIG. 1 and a tape cartridge;

FIG. 22 is a diagrammatic illustration of a portable data storage cartridge of FIG. 1 containing a non-volatile solid state memory assembly.

DETAILED DESCRIPTION OF THE INVENTION

This invention is described in preferred embodiments in the following description with reference to the Figures, in which like numbers represent the same or similar elements. While this invention is described in terms of the best mode for achieving this invention's objectives, it will be appreciated by those skilled in the art that variations may be accomplished in view of these teachings without deviating from the spirit or scope of the invention.

Figure 1:
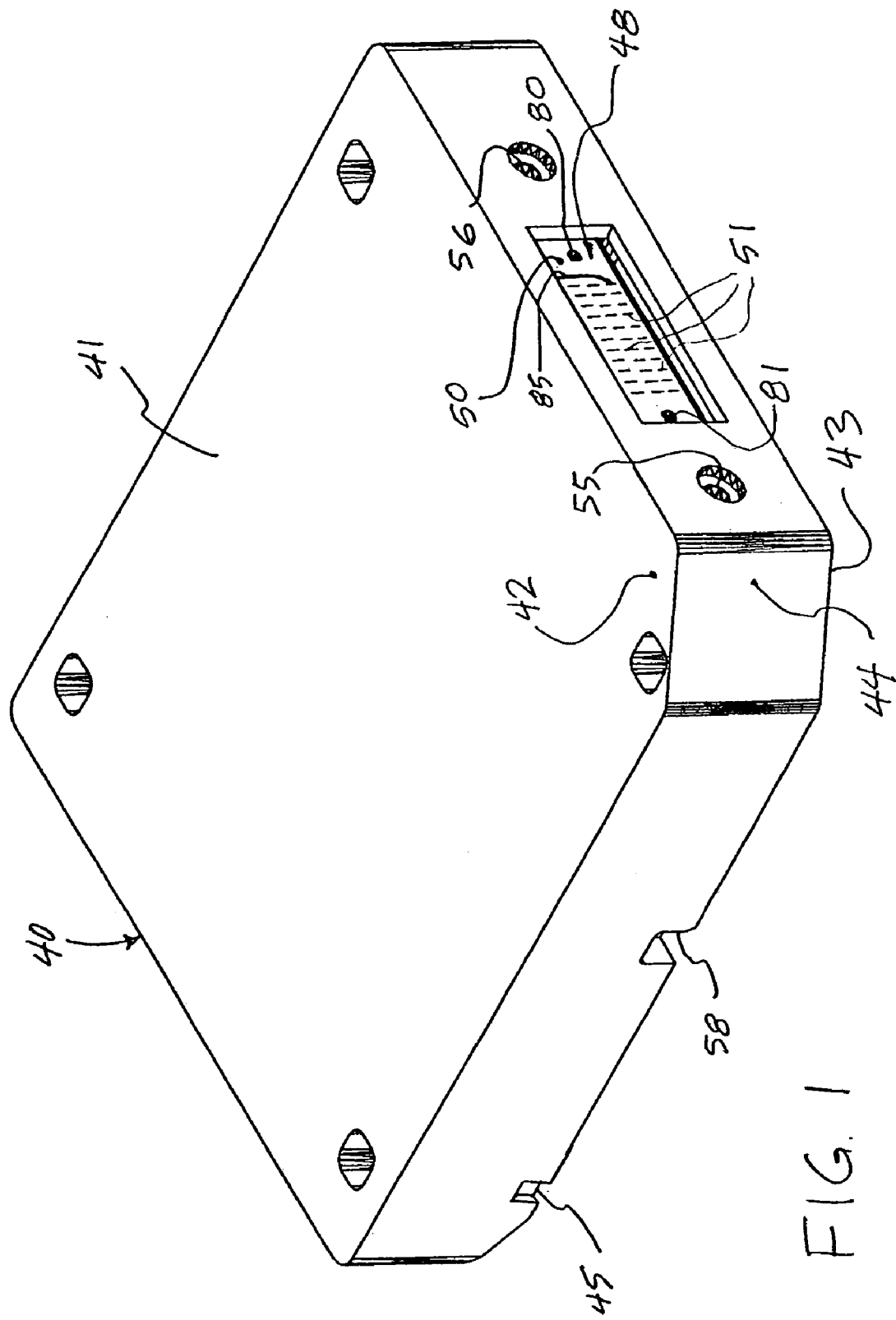
FIG. 1 is an isometric view of a portable data storage cartridge containing a data storage device in accordance with the present invention.

Referring to FIG. 1, a data storage cartridge 40 is provided having a cartridge shell 41 comprising a substantially identical exterior dimensional form factor as a tape cartridge with its leader block. The data storage cartridge comprises a blocking portion 42 to differentiate identification of the data storage cartridge 40 from a tape cartridge. In one aspect, the blocking portion 42 is opaque to optically block an optical source from a corresponding sensor, whereas the prior art leader block hole will transmit an optical beam, thereby differentiating the data storage cartridge 40 from a tape cartridge. Alternatively, or additionally, an opaque blocking portion 43 may be located on the opposite side of the data storage cartridge 40. In another aspect, a blocking portion 44 is located at a side of the location of the leader block hole at which the threading pin of a tape drive begins engagement of a tape cartridge, and thereby prevents engagement of the data storage cartridge and provides differentiated identification of the portable data storage cartridge.

A notch 45, similar to the notch of a tape cartridge, is provided to interlock with a holder in a storage shelf of an automated data storage library which tends to hold the data storage cartridge in position in the shelf.

As will be discussed, the cartridge shell 41 mounts a data handling agent, such as a data storage device, therein. Also as will be discussed, an external data transfer interface electrical connector 48 is provided, incorporating a substrate 50, having electrical contacts 51 on a facing surface of the substrate. The electrical contacts 51 are coupled to the data handling agent, and are arranged to match electrical contacts of a transfer station, when in a face-to-face relationship.

Alignment, or registration, holes 55 and 56 are provided and mate with corresponding alignment pins of the transfer station to laterally align and register the data transfer interface of the portable cartridge 40 with a data transfer interface of the transfer station.

Figure 2:
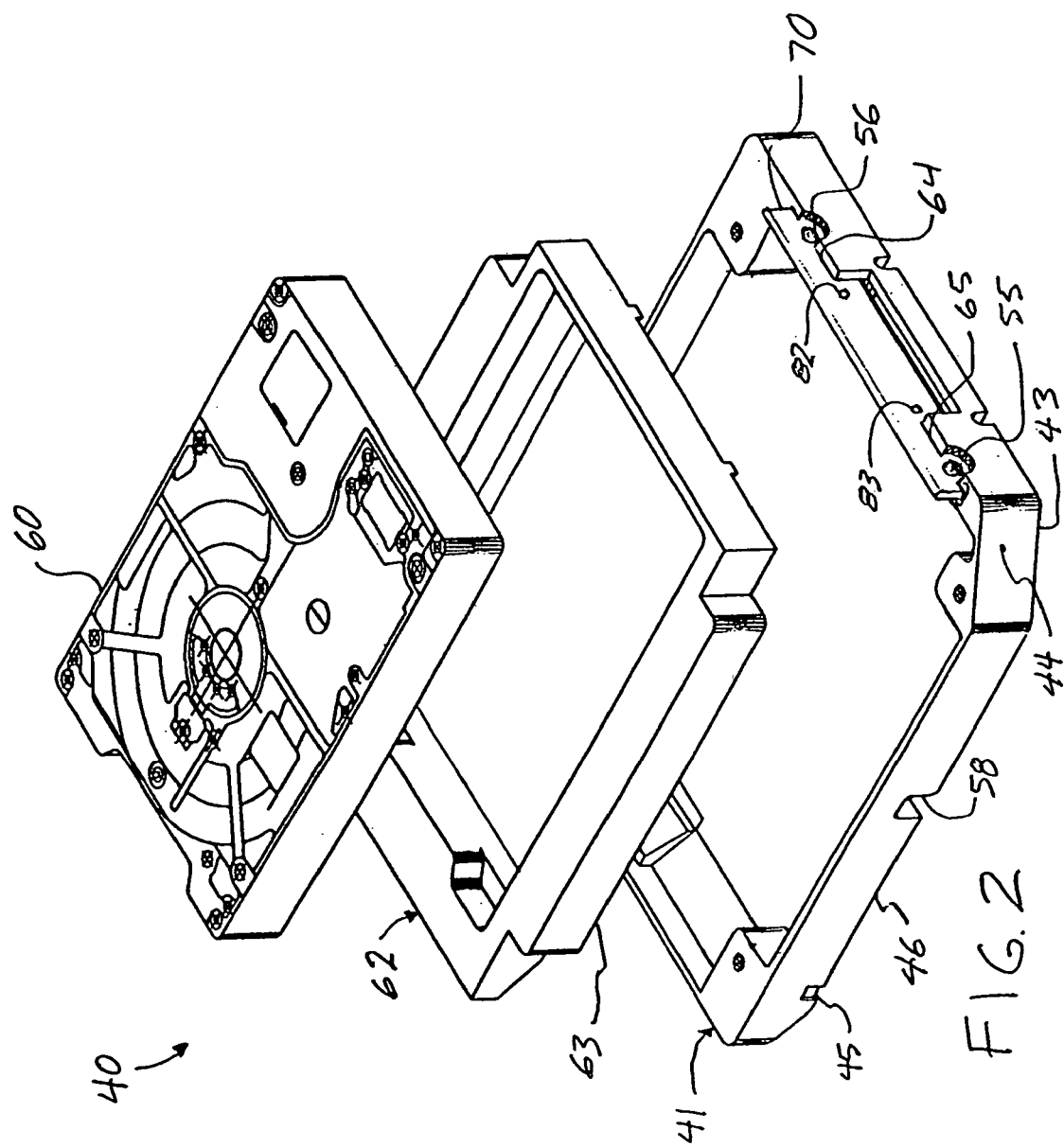
FIG. 2 is an exploded view of an example of a portable data storage cartridge of FIG. 1 containing an encased magnetic data storage drive.
Figure 3:
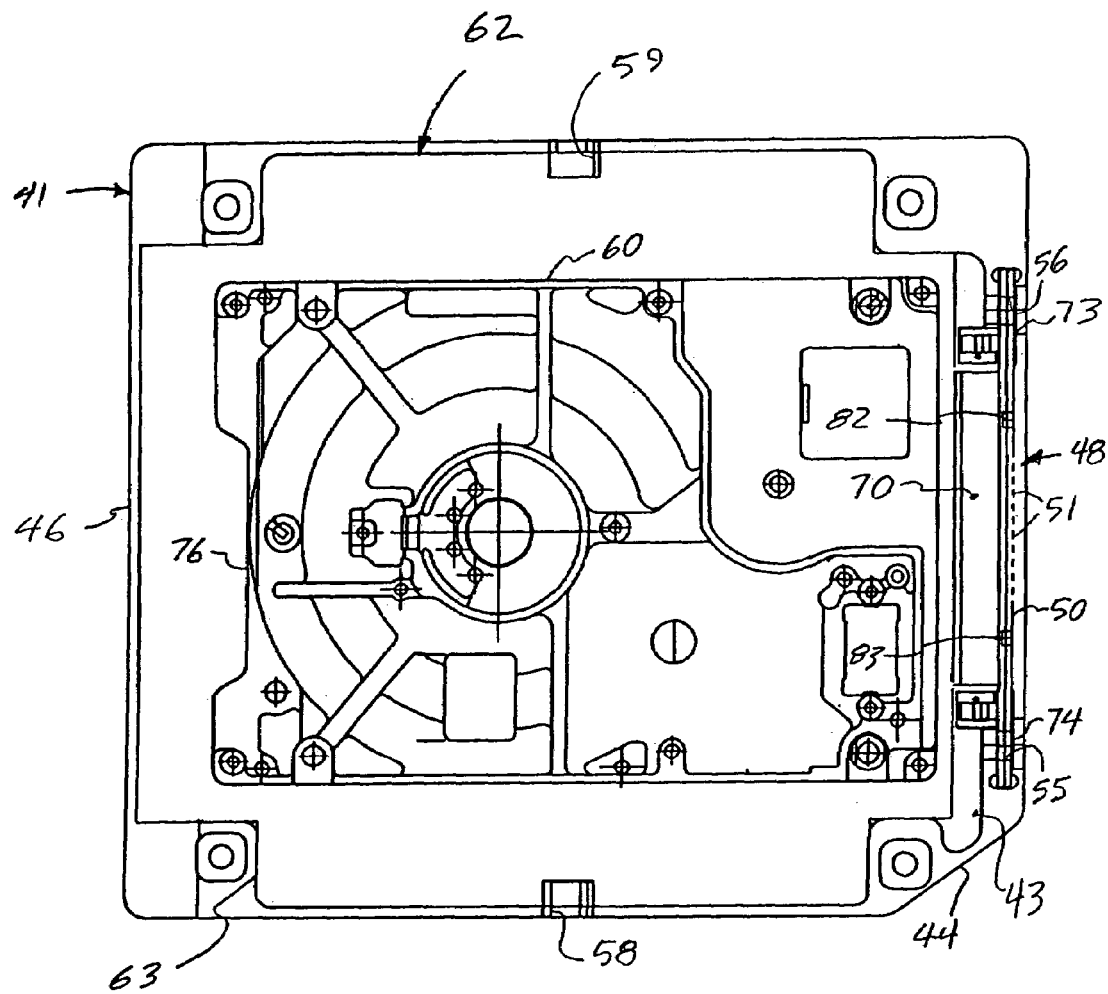
FIG. 3 is a plan view of the portable data storage cartridge of FIG. 2.

An exploded view of an example of a portable data storage cartridge 40 of FIG. 1 is illustrated in FIG. 2, and a plan view is illustrated in FIG. 3, and contains an encased, self-contained and operational magnetic data storage drive 60. An example of an encased, self contained, magnetic data storage drive of the desired form factor to fit within the cartridge shell 41 comprises the IBM Travelstar 2.5 inch series of magnetic data storage drives. Specifically, FIGS. 2 and 3 illustrate the bottom half 46 of the cartridge shell 41.

Referring to FIGS. 1–3, in one aspect, notches 58 and 59 are provided to allow a loader of the transfer station to engage the portable data storage cartridge 40 and to force the electrical contacts 51 of the data transfer interface electrical connector 48 into non-wiping contact with matching electrical contacts of the transfer station.

Figure 4:
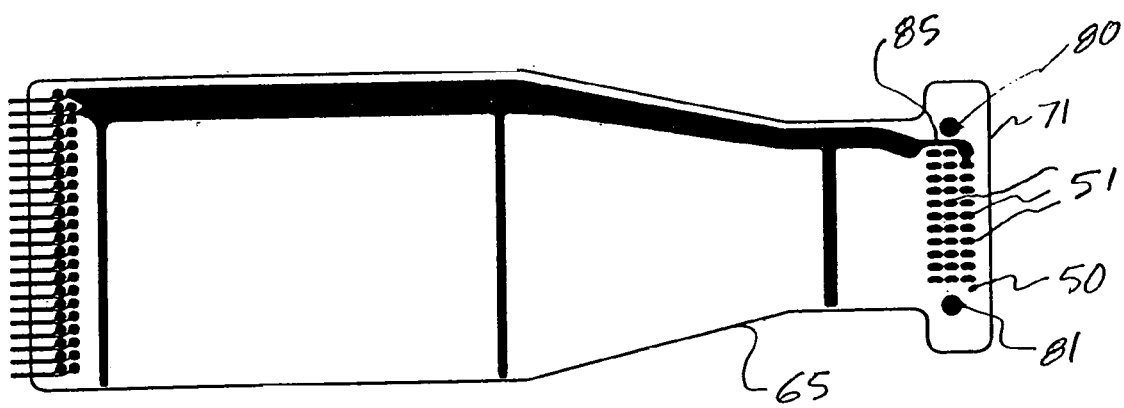
FIG. 4 is a plan view illustration of a flex cable of the portable data storage cartridge of FIG. 2.

In another aspect, a shock mount 62 supports and mounts the data storage device within the cartridge shell 41. Specifically, FIGS. 2 and 3 illustrate the bottom half 63 of the shock mount 62. The shock mount 62 is arranged to insure that the data storage device is fully separated from and isolated from potential mechanical contact with the cartridge shell or the data transfer interface electrical connector 48. Referring additionally to FIG. 4, a flex cable 65 both provides the electrical contacts 51 at a substrate 71 and interconnects the data storage device and the external data transfer interface 48, while also isolating mechanical contact between the data storage device and the cartridge shell 41, thereby further insuring the full separation and mechanical isolation of the data storage device, such as the encased magnetic disk drive assembly 60, from the cartridge shell 41. As the result, the data storage device is protected from rough handling and is able to withstand the dropping of the cartridge, or misplacement the cartridge such that it is handled roughly, either through actions of a robot accessor or through manual handling.

With respect to this aspect of the present invention, the cartridge shell 41, shock mount 62, data transfer interface 48, and flex cable 65 may comprise any configuration suitable for supporting a particular data storage device, while isolating mechanical contact between the data storage device and the cartridge shell. Specifically, the cartridge shell 41 may comprise an exterior dimensional form factor differing from that of a tape cartridge with a leader block.

The data storage device 60 is preferably encased, self-contained and operational, comprising both the necessary mechanical and electronic components. In the context of an encased magnetic disk drive assembly, the assembly comprises at least one rotatable disk, a motor for rotating the disk(s), at least one head, an actuator and servo system for seeking and tracking, and addressing, motor control, and data handling electronics for reading and writing data, and for communicating at the data transfer interface, for example, employing an industry standard format, such as IDE, SCSI or PCI. Thus, the device does not have to be opened to provide data transfer.

Figure 5A:
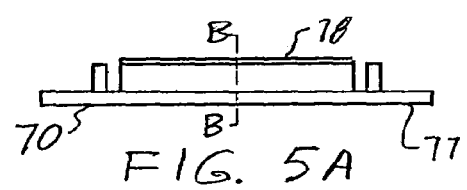
FIGS. 5A and 5B are respective top and cross-section views of a backing plate of the portable data storage cartridge of FIG. 2.
Figure 5B:
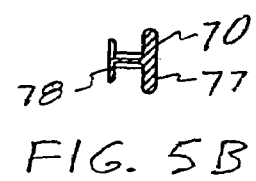
Figure 6:
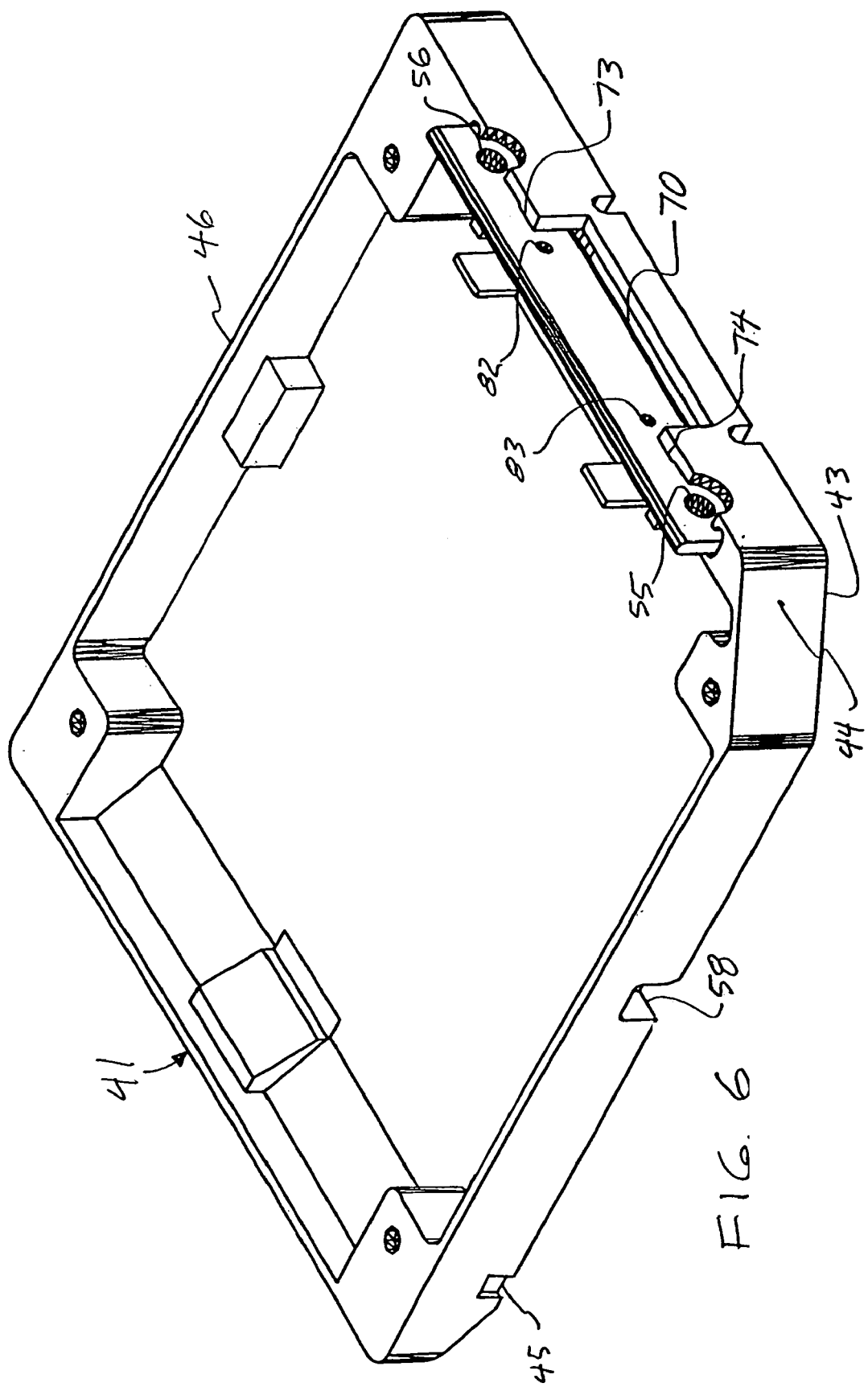
FIG. 6 is an isometric view of the bottom half of the cartridge shell of FIG. 2, with the backing plate of FIGS. 5A and 5B.
Figure 7:
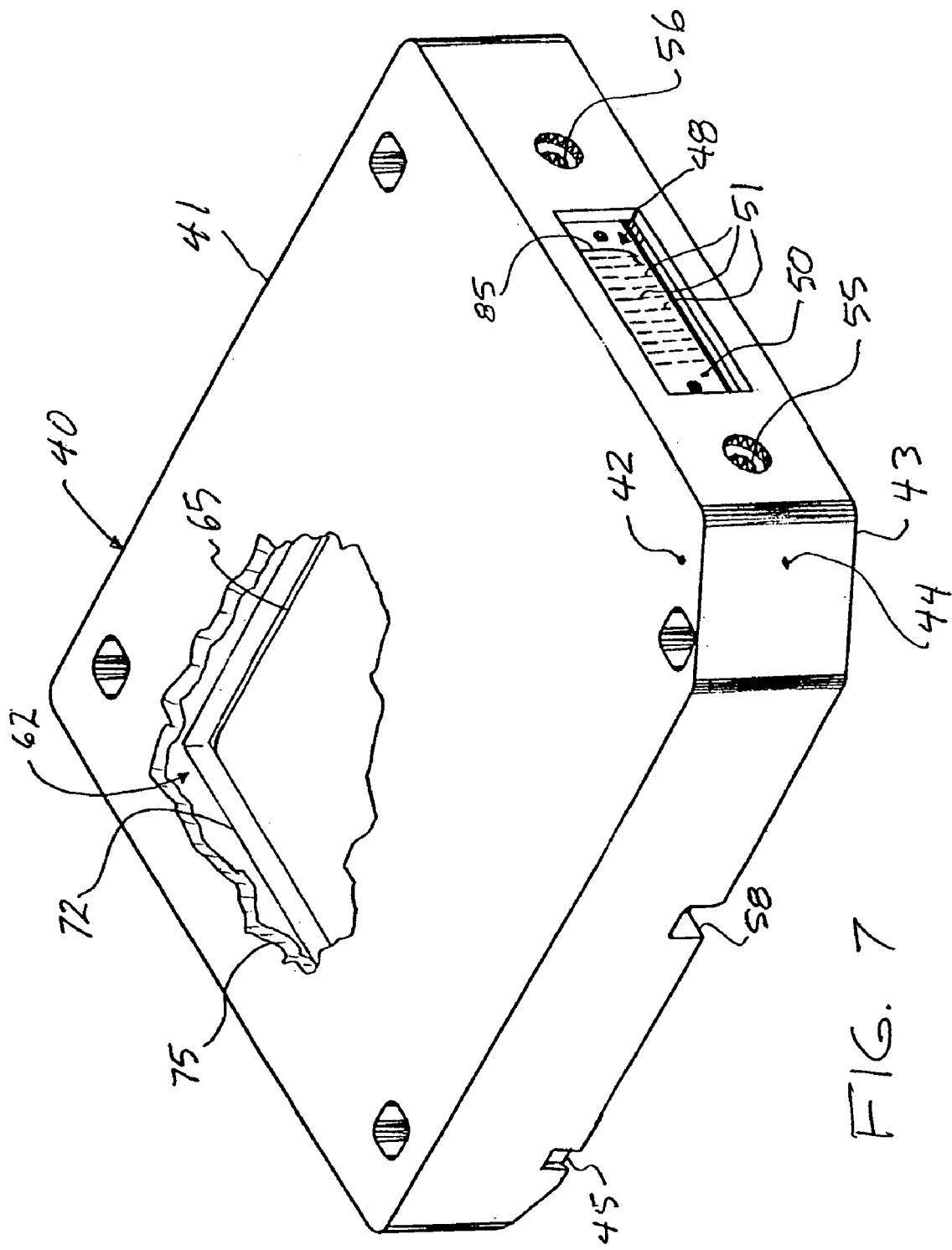
FIG. 7 is a partially cut away isometric view of the portable data storage cartridge of FIG. 2 illustrating the flex cable of FIG. 4.

Referring additionally to FIGS. 5A, 5B, 6 and 7, a substantially flat backing plate 70 is provided which supports and mounts a termination 71 of the flex cable 65 of FIG. 4, forming the electrical connector 48. The backing plate 70 and flex cable termination 71 snap into slots 73 and 74 in the cartridge shell 41 for mechanical support. The backing plate 70 thus supports and positions the facing surface 50 of the flex cable 65 to form the external data transfer interface electrical connector. FIG. 7 also illustrates the top half 72 of the shock mount 62 and the top half 75 of the cartridge shell 41.

The flex cable 65 comprises a plurality of lands coupled to the electrical contacts 51 of the facing surface 50 at the termination 71, and are coupled to the data storage device, such as encased magnetic data storage drive 60, for example, at a connector 76 at the rear to provide the above described mechanical isolation.

In one embodiment, the electrical contacts 51 of the substantially flat substrate facing surface 50 comprise pads containing gold for providing gold contact surfaces. For example, the contacts comprise copper pads on which are plated a diffusion barrier, such as nickel, and Type II gold pads plated on the diffusion barrier, but which are plated to a thickness greater than standard. As an example, the thickness of the gold pads is substantially 100 micro inches. As defined by those of skill in the art, a plating of about 8 micro inches is considered a "flash", about 15 micro inches is considered "adequate", and about 30 micro inches is considered "standard". The diffusion barrier is preferably plated to a thickness greater than 50 micro inches. Type II gold pads are also referred to as "hard gold" by those of skill in the art, and comprises a defined set of alloys. Preferably, the gold pads are electrolytically plated.

In an alternative embodiment, other materials having characteristics similar to gold may be employed for the electrical contacts 51, such as palladium or palladium-nickel. Pads containing palladium forming the electrical contacts may have a gold "flash" layer.

In a preferred embodiment, the electrical contacts 51 are substantially flat, having substantially flat contact surfaces on the pads. Electrical contact physics defines that the actual contact is made via small microstructure high spots on the contact surface, referred to as "aspirates", distributed throughout the contact interface, even though the contact surface is substantially flat.

As an alternative embodiment, the electrical contacts 51 may comprise shaped contacts having shaped surfaces on the pads. In "Hertzian" theory, shaping the surfaces tends to concentrate contact force in small contact area. The shaping may be achieved by plating or material removal, and may assume various shapes, referred to as, e.g., dimple, crowned, hertzian stress dot, flat on sphere, dendrite, crossed cylinders, sphere on cup, or sculptured.

Further, at least one of the electrical contacts 51 of the substantially flat substrate facing surface comprises an elongated contact, as will be discussed.

As illustrated by the cross section shown in FIG. 5B, the backing plate 70 is in the general form of an "H" beam, with a front portion 77 supporting and positioning the flex cable termination 71, and a rear portion 78 which provides structural strength. As will be discussed, the data storage cartridge 40, when loaded into the transfer station, will be subjected to considerable force in a direction normal to the facing surface 50, for example, over 10 pounds, to effect the non-wiping contact with the transfer station data transfer interface, requiring that the backing plate have considerable structural strength, for example, comprising a hard, durable plastic. Examples of plastics having good structural strength comprise "Ryton", a polyphenylene sulphide resin from Phillips 66; "Ultem", a polyetherimide resin from GE, and "Lexan", a polycarbonate from GE.

In another aspect, the alignment, or registration, holes 55 and 56 are provided in the substantially flat backing plate 70 in close proximity to the substantially flat substrate 50. The substrate 50 of the flex cable termination 71 is aligned with respect to the backing plate 70 at the time of assembly by use of a probe inserted through holes 80 and 81 of the termination 71 and into holes 82 and 83, respectively, of the backing plate 70. Thus, the substantially flat substrate facing surface 50 is aligned with respect to the backing plate 70 and the alignment or registration holes 55 and 56 therein. The alignment holes are arranged for mating with corresponding transfer station alignment pins to register the external data transfer interface electrical connector 48 with respect to the transfer station.

The flex cable 65, in addition to coupling with the data handling agent, or data storage device, to provide data transfer with the contacted transfer station, is coupled to a power input of the data handling agent to provide power from the transfer station to the data handling agent.

In another aspect, when registered and aligned with the transfer station, the backing plate 70 is in contact with the alignment pins at holes 55 and/or 56. The backing plate 70 comprises a semiconductive plastic material having electrical resistivity. In one example, the material has sufficient embedded carbon to provide the electrical resistivity, comprising 10%–30% carbon filled plastic. As an alternative, the backing plate 70 comprises two plates, one plate comprising the "H" beam, and the other plate, preferably in front of the "H" beam, and with the alignment holes, comprising a carbon filled semiconductive member. The backing plate is electrically coupled to the data storage device by means of land 85 of flex cable 65, to a ground thereof, thereby forming an electrostatic discharge path from the data storage device to the backing plate and through the electrically semiconductive material to the alignment pins of the transfer station, which are electrically grounded, as will be discussed. Any of the above discussed plastics may be carbon filled and employed as the backing plate 70 or as the carbon filled one of two plates. A specific example of a carbon filled plastic comprises a 20% carbon filled polycarbonate, called "Stat-Kon DC-1004-FR".

Figure 8:
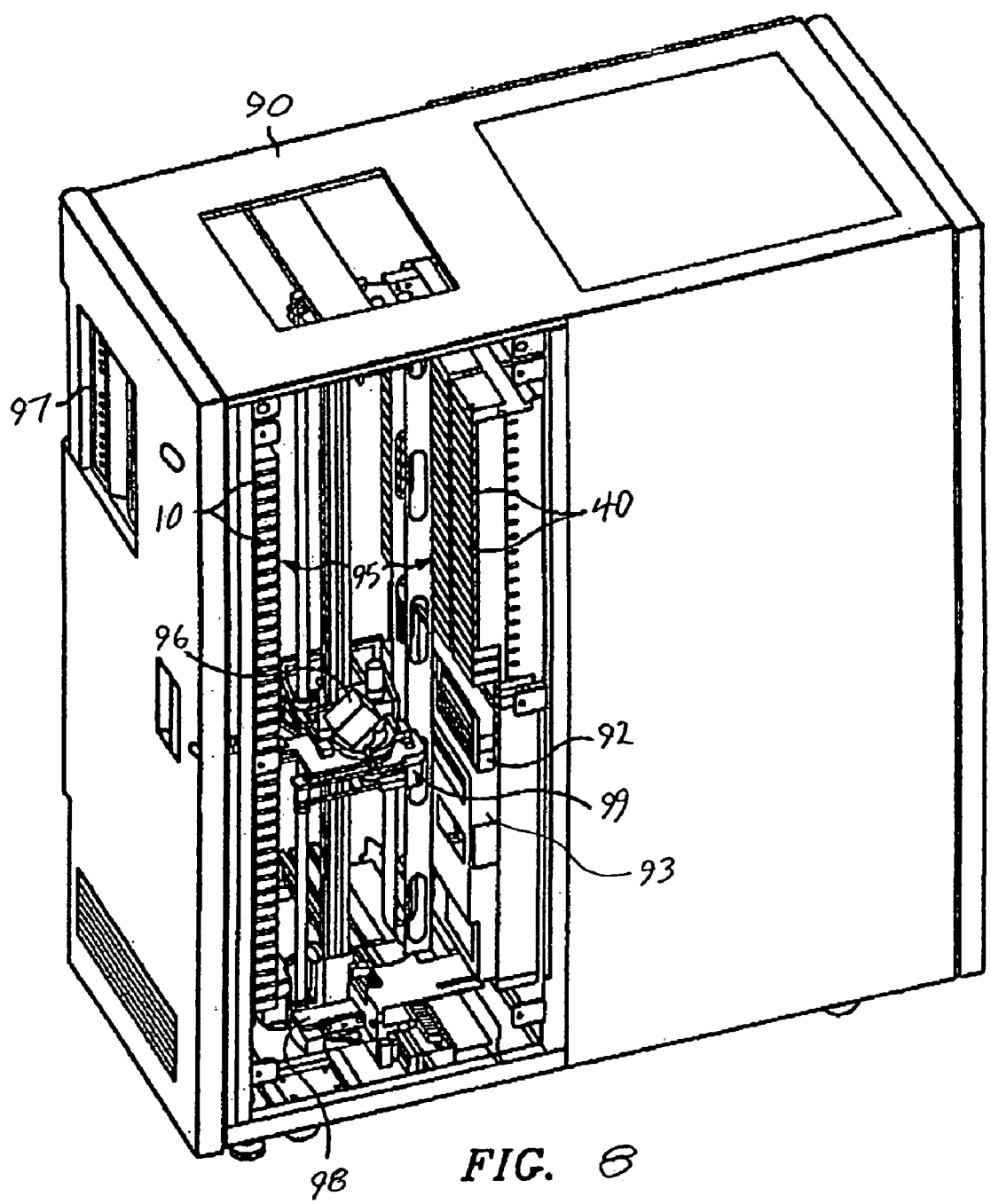
FIG. 8 is an isometric view of an automated data storage library for storing, transporting, and providing data transfer with respect to portable data storage cartridges of FIG. 1.
Figure 9:
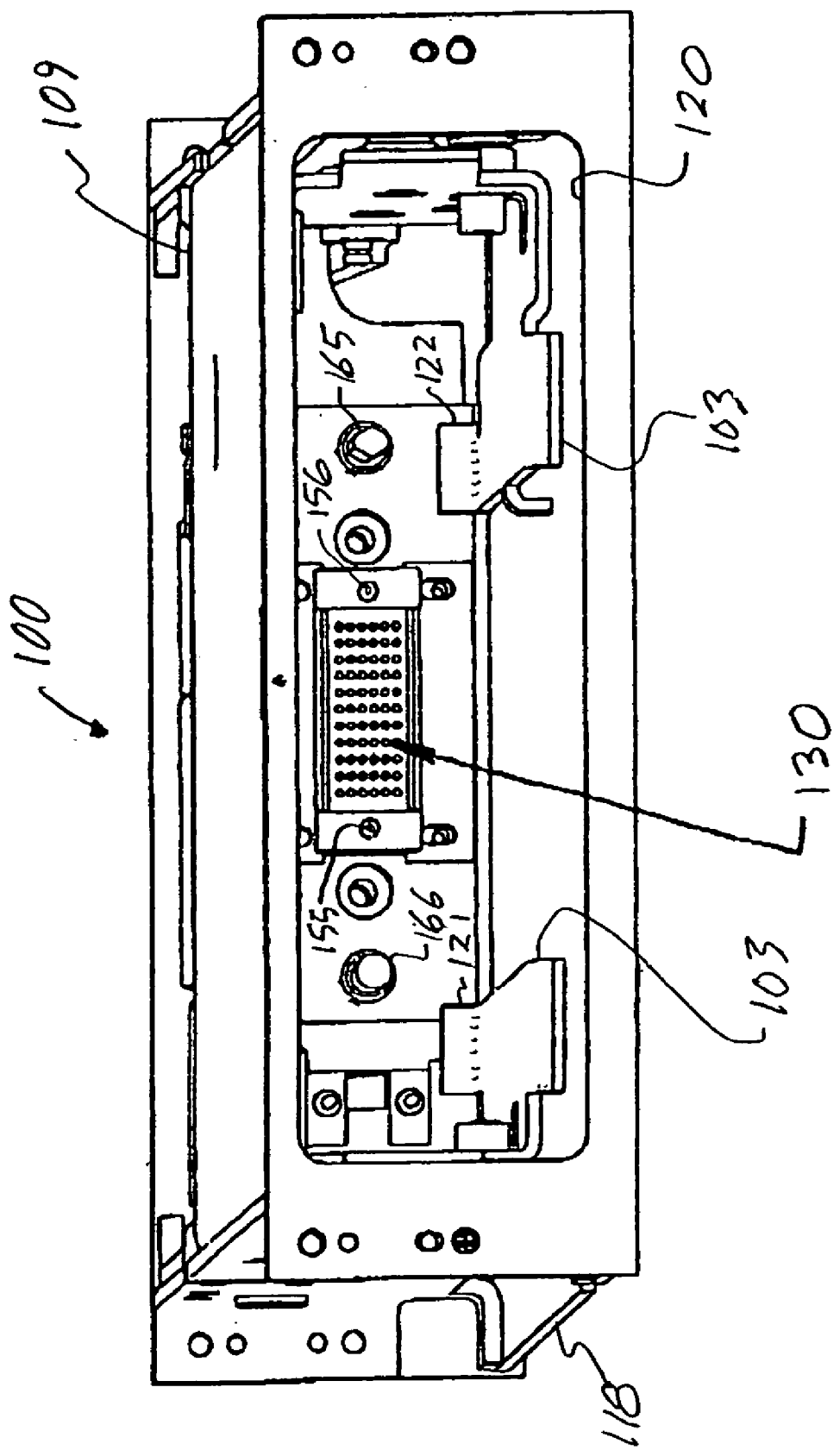
FIG. 9 is an isometric view of a transfer station for providing data transfer with respect to the portable data storage cartridge of FIG. 1 and for differentiating the portable data storage cartridge of FIG. 1 from a tape cartridge.

FIG. 8 illustrates an automated data storage library 90 for storing, transporting, and providing data transfer with respect to tape cartridges 10 and portable data storage cartridges 40 of FIG. 1. The library 90 comprises at least one, and preferably a plurality of, data storage drives 92 for reading and/or writing data on data storage media, such as the tape cartridges 10. Additionally, the library comprises at least one, and preferably a plurality of, transfer stations 93 for providing data transfer with respect to the data storage cartridges 40. Both the tape cartridges 10 and the data storage cartridges 40 are stored in storage shelves 95. The various cartridges may be stored in a segregated manner or may be stored randomly throughout the storage shelves. A typical automated data storage library also comprises one or more input/output stations 97 at which a cartridge may be received or delivered. A robot accessor 98, including a gripper 99, grips and transports a selected cartridge 10 or 40 amongst a storage shelf 95, an input/output station 97, a transfer station 93 and/or a data storage drive 92. The automated data storage library robot accessor may also include a media sensor 96. The media sensor 96 may comprise a label reader, such as a bar code scanner, or a reading system, such as a smart card or RF (radio frequency) reader, or other similar type of system, which is able to identify the cartridge, such as by means of its volume serial number, or VOLSER. As one example, the VOLSER may comprise a label placed on the cartridge which is read by a bar code reader. As another example, the VOLSER may be in recorded in an RF chip in the cartridge which is read by an RF receiver.

FIGS. 9–20 illustrate an embodiment of a transfer station 100 and various components. The transfer station may be employed on a stand-alone basis, or may comprise a transfer station 93 of the automated data storage library 90 of FIG. 8.

In one aspect, referring to FIGS. 9–12, the transfer station 100 is arranged to provide data transfer with respect to portable data storage cartridges 40 of FIG. 1, where the portable data storage cartridge has generally an exterior dimensional form factor of a tape cartridge 10 having a leader block. As discussed above, the leader block comprises a hole therethrough for engagement by a threading pin. Also as discussed above, the portable data storage cartridge 40 comprises a blocking portion, such as the blocking portion 42, of the cartridge shell 41, which is opaque.

The transfer station 100 comprises a receiver 103 for receiving the portable data storage cartridge. The cartridge may be received manually, or may be received from the robot accessor of the automated data storage library 90 of FIG. 8, or may be received from an automated cartridge loader (ACL) as is known to those of skill in the art.

Optical sources 105 and 106 are mounted at openings 107 and 108 of a top plate 109 of the transfer station. Sensors 115 and 116 are mounted on a printed circuit board (PCB) 118 for sensing the optical sources 105 and 106, respectively. The optical sources 105 and 106 preferably comprise an infrared source, such as an LED optical source, which is focused, providing a focused beam directed toward the respective sensor 115 and 116, which preferably comprise infrared optical sensors.

Optical source 105 and corresponding sensor 115 are located near a receiving slot 120 of the transfer station into which the cartridge is inserted. Thus, as the cartridge, whether it is a tape cartridge 10 or a portable data storage cartridge 40, the cartridge interrupts the beam, such that the sensor 115 detects that a cartridge is being inserted into the receiver 103. Stops 121 and 122 are provided at the end of travel of receiver 103, and comprise the point at which the cartridge is fully received into the transfer station.

Optical source 106 is located at, and directed toward the location of the leader block hole 19 of a tape cartridge 10 and the location of the blocking portion 42 of a portable data storage cartridge 40 when a cartridge is at the end of travel in the receiver. The corresponding sensor 116 is positioned at the location of the leader block hole and blocking portion at the opposite side of the cartridge from the optical source 116. The sensor 116 may be enabled by the sensor 115, and senses the blockage of the optical source 106 by a cartridge shell blocking portion, thereby identifying the differentiated identification of the data storage cartridge, and indicating the presence of the portable data storage cartridge 40 at the end of travel in the receiver 103. Sensor 116 will therefore enable the transfer station to load the portable data storage cartridge 40. If the beam is not blocked, such that sensor 116 continues to detect the beam from the optical source 106, either the cartridge has not been fully inserted into the receiver 103, or the cartridge is a tape cartridge 10, and the beam is received through the leader block hole 19. In this situation, there is an error, and the transfer station will not proceed.

As is understood by those of skill in the art, one or both source 105, 106 and corresponding sensor 115, 116 may be reversed, the source located on the PCB 118, and the sensor on the top plate 109. Also as is understood by those of skill in the art, alternative locations intermediate the PCB and on the top plate may also be employed for mounting the sources and sensors.

Referring to FIGS. 9 and 13–15, in another aspect, a data transfer interface electrical connector 130 of the transfer station 100 is illustrated for mating with the external data transfer interface electrical connector 48 of the portable data storage cartridge 40, of FIGS. 1–7. The transfer station 100 releasably, repeatably provides an electrical coupling with respect to the cartridge external data transfer interface, which comprises a substrate 71 having a plurality of substantially flat electrical contacts 51 on a substantially flat facing surface 50 thereof, the substrate mounted in a portable cartridge 40 capable of being engaged by a loader.

The electrical connector 130 comprises an elastomeric compression element 132 having a plurality of protruding compression members 133 supported by a reference plate 134. Preferably, the compression element is fixed to the reference plate 134. As examples, the compression element may be cemented, bonded, or vulcanized to the reference plate. The compression element is positioned at a rear surface 135 of a matching circuitized flexible substrate 136, which preferably comprises a termination of a flex cable 138. The matching circuitized flexible substrate 136 has electrical contacts 141 on a facing surface 140 thereof, the electrical contacts 141 arranged to match the portable cartridge electrical contacts 51 when in a face-to-face relationship. The protruding compression members 133 of the compression element 132 are facing and in contact with the rear surface 135, such that the individual compression members 133 are registered with the corresponding individual electrical contacts 141.

The compression element 132 is generally of the type described in U.S. Pat. Nos. 4,902,234; 5,059,129; 5,873,740; or 5,947,750.

At least ones of the electrical contacts 141 of the matching circuitized flexible substrate 136 of flex cable 138, and corresponding ones of the electrical contacts 51 of the substantially flat substrate facing surface 50 of the flex cable 65 of FIG. 4, comprise elongated contacts, the contacts 141 each registering with two adjacent individual compression members 133 of the elastomeric compression element 132. In this manner, the elongated contacts comprise redundant contacts over two compression members, and have matching contact surfaces which are at least twice as great in surface area as a single contact of the size of a single compression member.

Thus, in the electrical connector 130, the circuitized flexible substrate 136 is positioned on the elastomeric compression element 132 such that a rear surface of the substrate is in contact with the compression members 133, and the elongated contacts 141 on the facing surface 140 of the substrate are registered with two adjacent individual compression members 133. Further, in the electrical connector 48, when the substrate 71 is registered in face-to-face relation with the facing surface 140 of the mating electrical connector 130, the elongated contacts 51 are each positioned to overlie two adjacent individual compression members 133, and with the elongated electrical contacts 51 in releasable contact with corresponding elongated contacts 141.

The elongated contacts 51, 141 registering with two adjacent compression members 133 provide redundant contacts with independent normal force generation. Specifically, each adjacent compression member provides the contact normal force to a discrete region of the elongated pad, and the ability of each region to make reliable contact can be considered independent and therefore redundant. For well designed electrical contacts operating at an intrinsic failure rate (FR), the effect of adding redundant contacts is to reduce the overall contact failure rate. The effective failure rate (EFR) for multiple contacts in parallel can be estimated by dividing the failure rate (FR) by the number of contacts in parallel. Specifically, (EFR)=(FR)/(# of contacts in parallel). Thus, as shown by the equation, the additional of a second, redundant contact reduces the effective failure rate of a contact by about ½.

The effect of redundant contacts on the plug dependent failure rate, or the ability of a contact to make electrical contact during first plugging follows a similar equation. Therefore, two contacts in parallel provide a higher probability of successfully plugging an electrical connector, and, hence, the data handling device.

As with respect to the electrical contacts 51 of flex cable 65 of FIG. 4, the electrical contacts 141 of the substantially flat substrate facing surface 140 may comprise pads containing gold, and preferably comprise copper pads on which are plated a diffusion barrier, such as nickel, and Type II, or "hard", gold pads plated on the diffusion barrier, but which are plated to a thickness greater than standard, for example, to a thickness of substantially 100 micro inches. The diffusion barrier is preferably plated to a thickness greater than 50 micro inches. Preferably, the gold pads are electrolytically plated.

The electrical contacts 141 may also alternatively comprise other materials, such as pads containing palladium, such as palladium or palladium-nickel, and may have a gold "flash" layer.

The electrical contacts 141 preferably are substantially flat, having substantially flat contact surfaces on the pads. Alternatively, the electrical contacts 141 may comprise shaped contacts having shaped surfaces on the pads, as discussed above.

Figure 12:
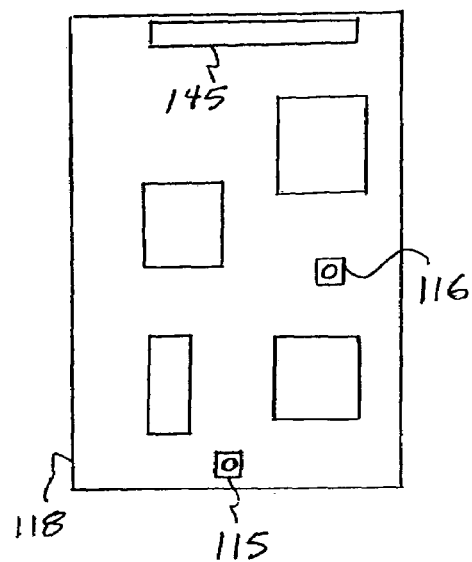
FIG. 12 is a plan view illustration of an example of a PCB mounting optical receivers for sensing the optical sources of FIGS. 11A and 11B.

The flex cable 138 comprises a plurality of lands coupled to the electrical contacts 141 of the facing surface 140 at the termination 136, and are coupled to the PCB 118 of FIG. 12 at connector 145 at termination 146 of the flex cable.

In another aspect, alignment, or registration, holes 155 and 156 are provided in close proximity to the electrical contacts 141. The flex cable termination 136 is aligned and the electrical contacts 141 registered with respect to the compression members 133 at the time of assembly by use of a probe inserted through holes 157 and 158 of the termination 136 and into holes 155 and 156, respectively, and the flex cable termination is tightened to a predetermined amount at the compression members. As will be discussed, the matching circuitized flexible substrate 136 is tightened only sufficiently to attain registration, while issuing from the elastomeric compression element 132 without an immediate change in direction, and subsequently forming a gradual curve 160, 161 in a direction normal to the facing surface 140. Then, clamps 162 and 163 are bolted into place to hold the circuitized flexible substrate in place. In the illustrated example, clamp 162 holds the flex cable at tail 164, and clamp 163 holds the flex cable 138. As will be discussed, when the external interface of the portable data storage cartridge is registered with the matching circuitized flexible substrate electrical contacts 141, a loader exerts a force on the portable cartridge normal to the facing surface 140, compressing the elastomeric compression element 132 between the matching circuitized flexible substrate 136 and the reference plate 134. The arrangement of the matching circuitized flexible substrate 136 to issue from the elastomeric compression element 132 without an immediate change in direction and subsequently form the gradual curve 160, 161 in a direction normal to the facing surface 140, allows the substrate to move freely in the normal direction without pulling in the lateral direction. This creates a non-wiping contact between the electrical contacts 51 of the portable cartridge substrate 50 of FIG. 1 and the electrical contacts 141 of the matching circuitized flexible substrate 136, thereby forming a releasable, repeatable electrical connection therebetween.

Figure 18:
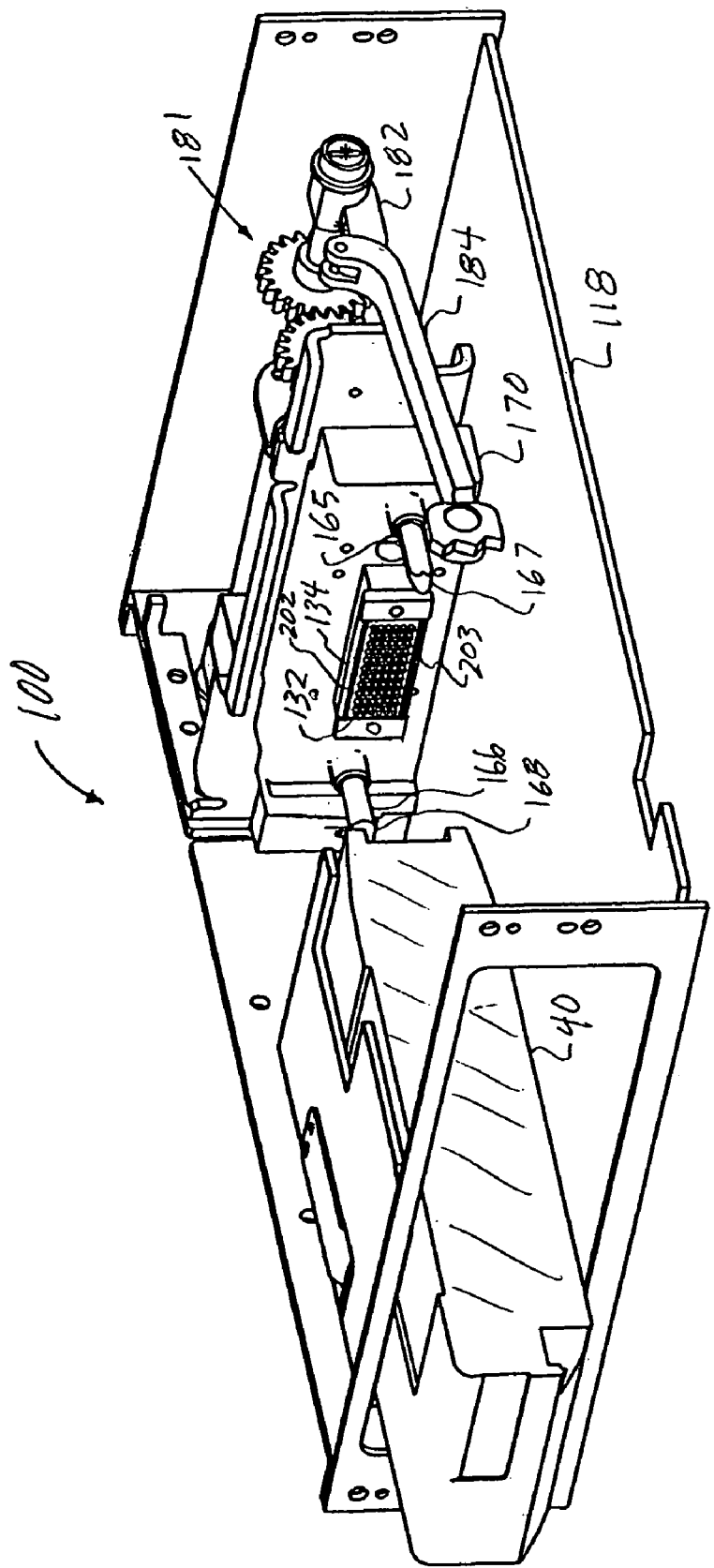
FIG. 18 is a cut away illustration of the transfer station of FIG. 9 and of a portable data storage cartridge of FIG. 1 with the loading mechanism in an unloaded position.

In another aspect, referring additionally to FIG. 18, the transfer station 100 additionally comprises alignment pins 165 and 166 for mating with respective registration holes 55 and 56 of the portable data storage cartridge 40 of FIG. 1 to register the external data transfer interface electrical connector 48 with the station data transfer electrical connector interface 130. Both alignment pins are aligned substantially normal to the facing surface 140 of the matching circuitized flexible substrate 136, and are tapered at the ends 167 and 168, respectively, to a rounded point in the direction of the portable cartridge substrate 50 to orient the portable cartridge substrate and gradually laterally align the portable cartridge substrate and the matching circuitized flexible substrate 136. To prevent tolerance buildup between the alignment pins and the respective registration holes, alignment pin 165 is preferably cylindrical, the same as the corresponding registration hole 55, and of a slightly lesser diameter. As an example, the alignment pin may have a diameter 5% less than that of the registration hole. However, alignment pin 166 is instead a non-round pin, such as a "diamond" pin, as is known to those of skill in the art, and is substantially narrower than pin 165, but of the same height. Thus, the external interface electrical connector 48 of the portable data storage cartridge 40 is properly registered in the vertical direction at both ends by the alignment pins and is properly registered in the horizontal direction by the alignment pin 165.

Figure 15:
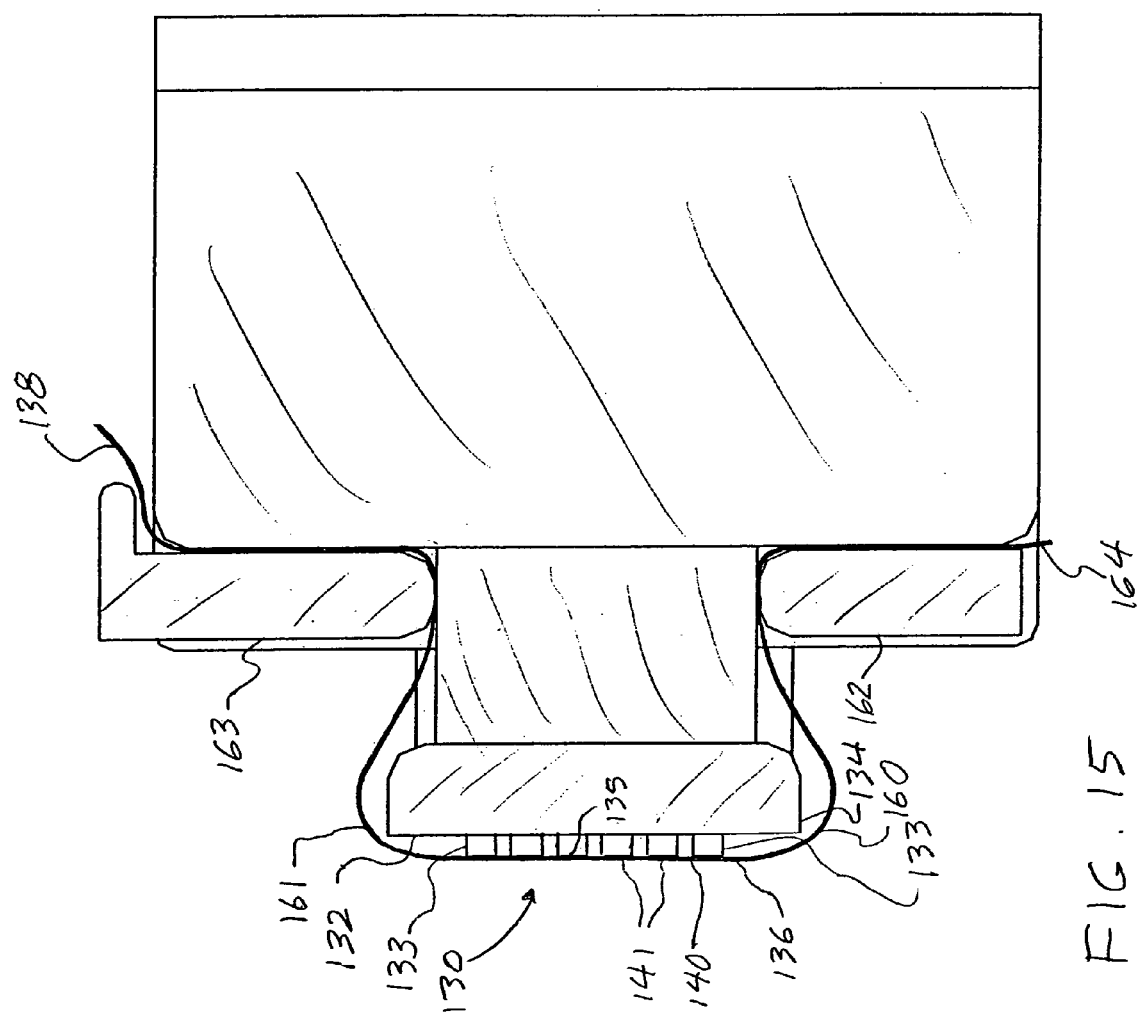
FIG. 15 is a cross section illustration of compression member, reference plate, support member and clamps of FIG. 13, with the flex cable of FIG. 14.
Figure 20:
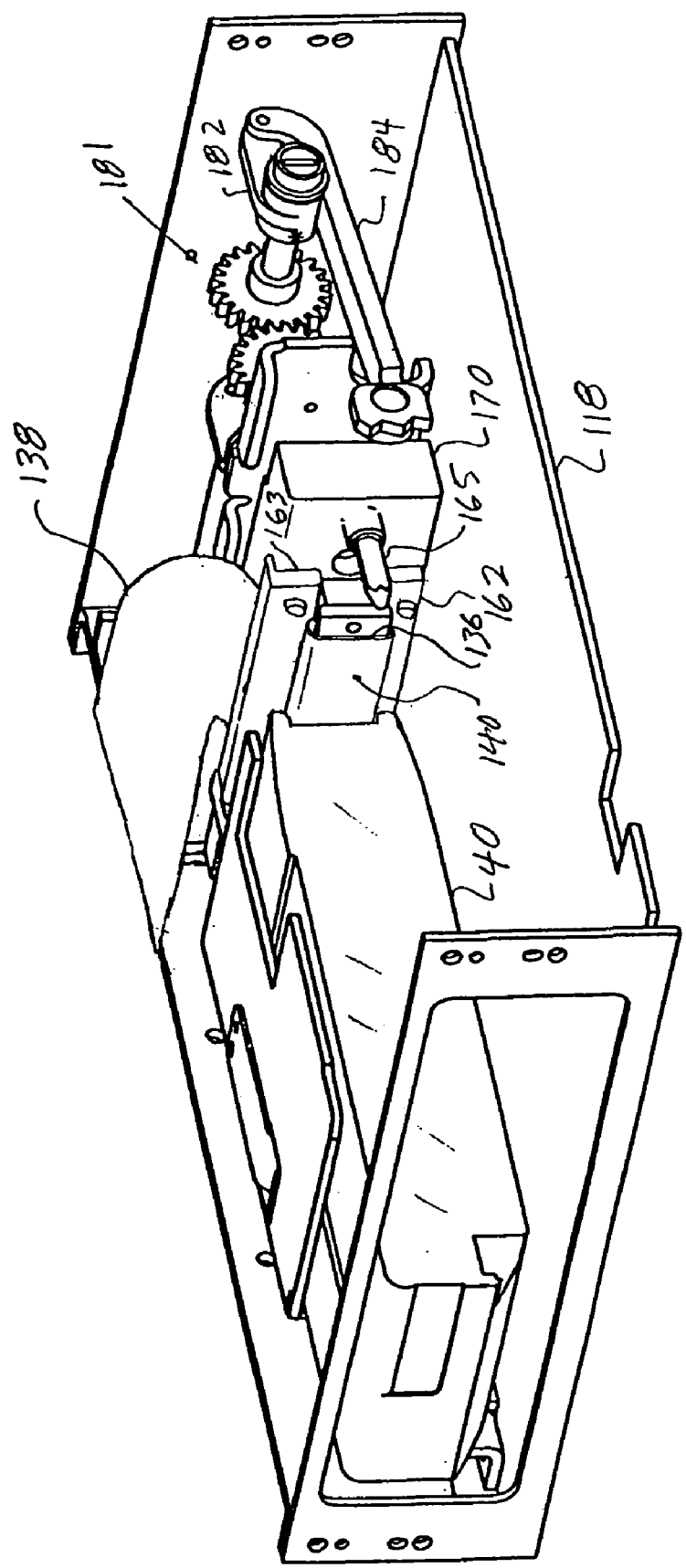
FIG. 20 is a cut away illustration of the transfer station of FIG. 9 and of a portable data storage cartridge of FIG. 1 with the loading mechanism in a loaded position.

In another aspect, referring to FIGS. 15 and 20, the facing surface 140 of the matching circuitized flexible substrate is oriented parallel to gravity, and the cartridge loader is oriented to provide the "normal" force orthogonal to gravity, to minimize debris deposition on the facing surface 140.

Figure 16:
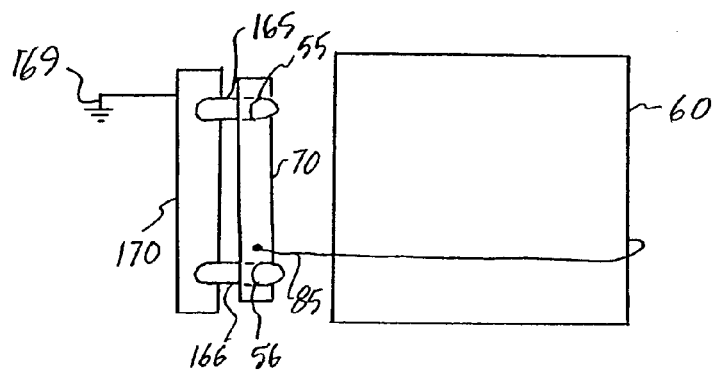
FIG. 16 is a circuit diagram illustrating an electrostatic discharge (ESD) path of the transfer station of FIG. 9 and of a portable data storage cartridge of FIG. 1.

In another aspect, and additionally referring to FIG. 16, when registered and aligned with the transfer station, the backing plate 70 of the portable data storage cartridge 40 of FIGS. 6 and 7 is in contact with the alignment pins 165 and 166 at registration holes 55 and/or 56. As discussed above, the backing plate 70, and therefore the registration holes 55 and 56 are electrically coupled to the data storage device, such as magnetic data storage drive 60, by means of land 85 of the flex cable, to a ground thereof, thereby forming an electrostatic discharge path from the data storage device to the backing plate and through the electrically semiconductive material to the alignment pins. The data storage device, since it is within a portable data storage cartridge, is not externally grounded and, as such, comprises an electrostatic source in the cartridge. The alignment pins 165 and 166 are conductive and coupled to a ground path 169, via support member 170, thereby forming an electrostatic discharge path from the registration holes 55 and 56 of the portable data storage cartridge 40 to the ground path 169.

Figure 10:
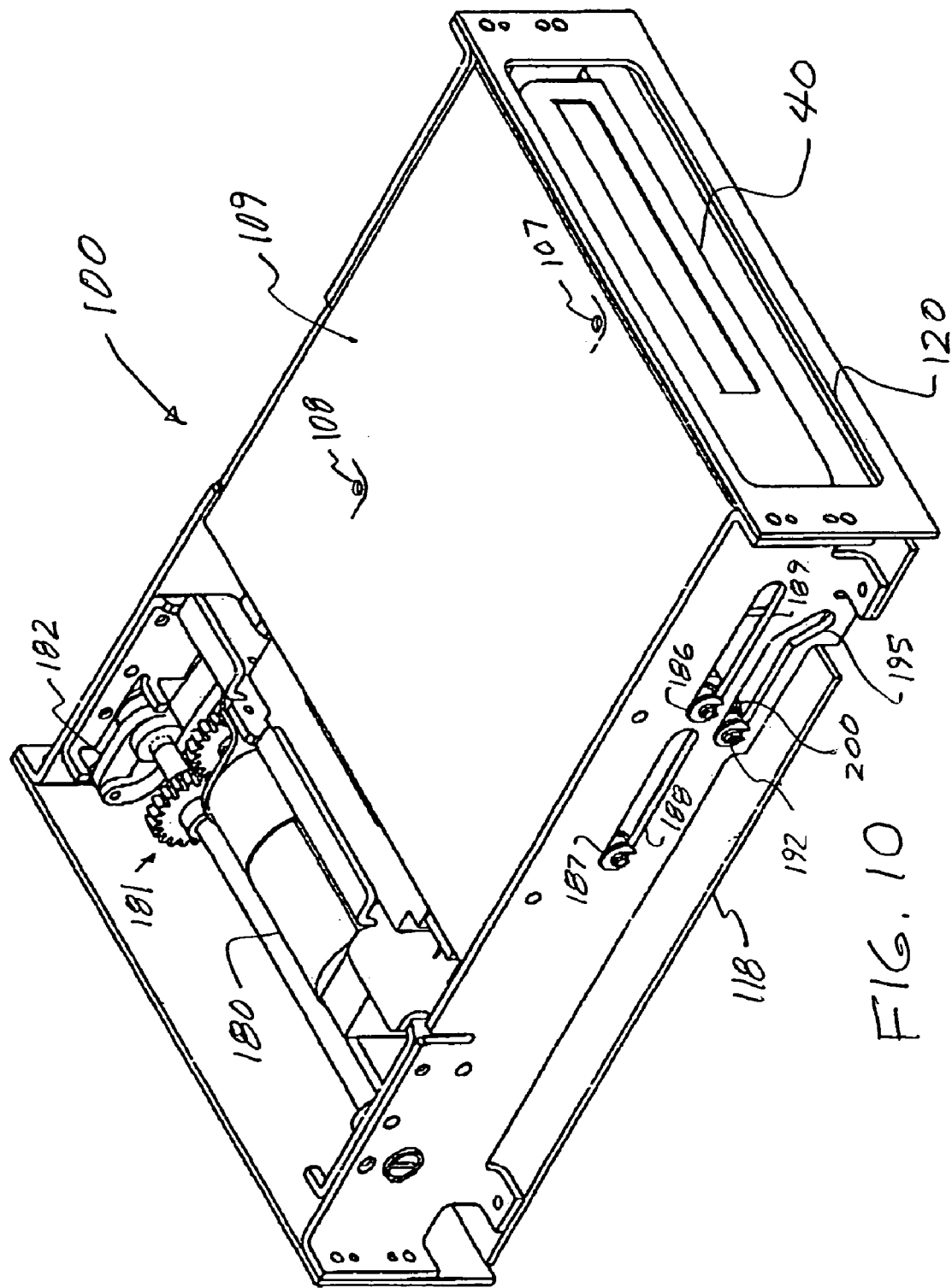
FIG. 10 is an alternative isometric view of the transfer station of FIG. 9, with a loaded portable data storage cartridge of FIG. 1.
Figure 17:
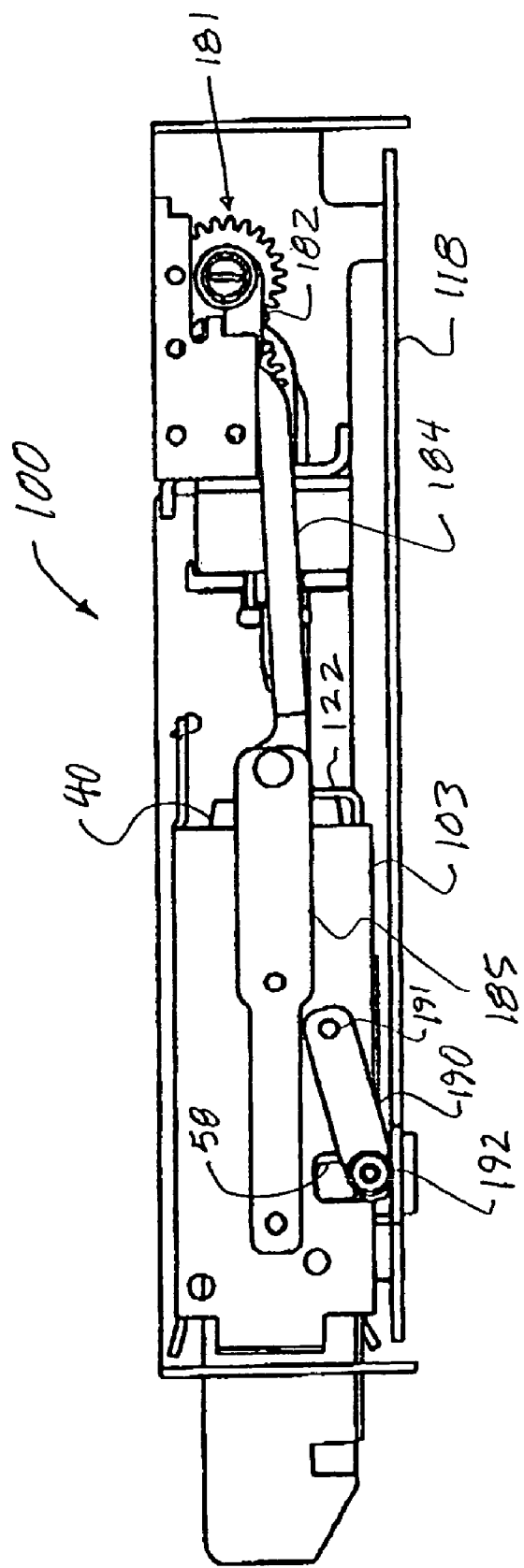
FIG. 17 is a side view cut away illustration of the transfer station of FIG. 9 illustrating the loading mechanism in an unloaded position.
Figure 19:
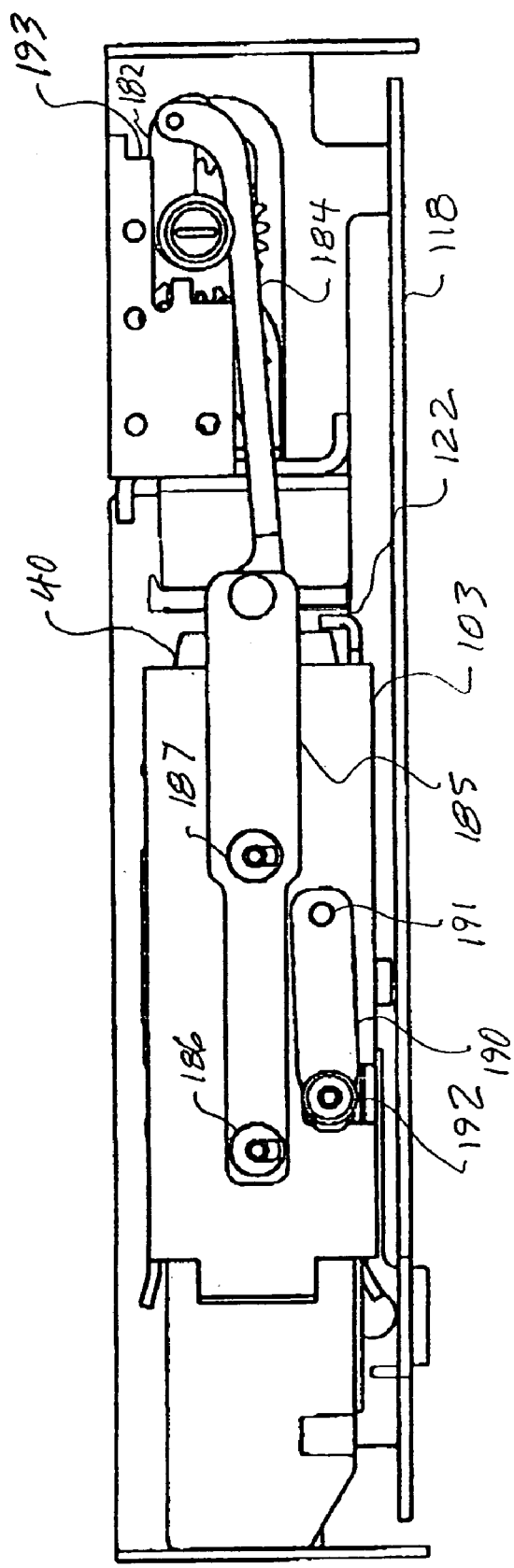
FIG. 19 is a side view cut away illustration of the transfer station of FIG. 9 illustrating the loading mechanism in a loaded position.

Referring to FIGS. 10 and 17–20, a loader of the transfer station 100 is illustrated which loads the portable data storage cartridge, exerting a force normal to the facing surface 140 of the flex cable 138 of FIG. 15. FIGS. 17 and 18 illustrate a cartridge 40 at the end of travel in the receiver 103 at the stops (only stop 122 is shown), and before the cartridge is loaded. FIGS. 10, 19 and 20 illustrate a cartridge that has been loaded. FIG. 20 also illustrates the flex cable 138 as arranged to loop over and outside the mechanism of the transfer station 100 to the PCB 118, thereby both allowing ease of assembly and of replacement of both the PCB and the flex cable.

The loading mechanism is initially at an "insert" position with motor 180 having operated through gear train 181 to rotate bell crank 182 toward the front of the transfer station 100. Bell crank 182 has thus pushed beam 184 toward the front of the transfer station, which pushed arm 185 of receiver 103, and therefore the receiver 103 towards the front opening 120 of the transfer station. Guides 186 and 187 of the arm 185 ride in slots 188 and 189 of the transfer station and movably support the receiver 103 as it moves forward and backwards. An engagement arm 190 is attached to the receiver 103 at pivot 191, and includes a guide 192 which moves in slot 195 of the transfer station. As is understood by those of skill in the art, the guides, arms, beams and slots are the same on each side of the receiver 103. Also as is understood by those of skill in the art, differing arrangements of guides, arms, beams and slots may be employed in accordance with the present invention.

When the receiver 103 is in the "insert" position toward the front opening 120 of the transfer station, slot 195 pulls guide 192 down, away from the receiver 103. An engagement pin 200 is located on the same shaft as guide 192, on the opposite side of arm 190, and protrudes toward the interior of the receiver 103. Thus, as the guide 192 is pulled down by slot 195, the engagement pin 200 is also pulled down, out of the interior of the receiver 103. This allows a portable data storage cartridge to be inserted into the receiver.

The loader is enabled by the sensor 116 of FIG. 12, which, as discussed above, identifies the differentiated identification of the data storage cartridge, indicating the presence of the portable data storage cartridge 40 at the end of travel in the receiver 103.

The sensor 116 enables motor 180 to operate through gear train 181 to rotate bell crank 182 away from the front, and toward the rear, of the transfer station 100. Bell crank 182 thus pulls beam 184 toward the rear of the transfer station, which pulls arm 185 of receiver 103; and therefore the receiver 103, towards the rear of the transfer station. As the receiver 103 is pulled toward the rear of the transfer station, slot 195 elevates guide 192 up, toward the receiver 103, such that engagement pin 200 is elevated into the receiver 103, where it engages the portable cartridge 40 of FIG. 1 at notches 58 and 59. As the receiver continues to be pulled toward the rear of the transfer station, the engagement pins 200 exert a force on the portable cartridge 40 normal to the facing surface 140 of the matching circuitized flexible substrate 136. First, the alignment pins 165 and 166 engage corresponding holes 55 and 56 of the cartridge to orient the portable cartridge substrate and gradually laterally align the portable cartridge substrate and the matching circuitized flexible substrate 136, registering the cartridge substrate electrical contacts 51 in face-to-face relation with the matching circuitized flexible substrate electrical contacts 141. Then the engagement pins exert the normal force on the portable cartridge and cause the portable cartridge substrate 50 (and backing plate 70) to compress the elastomeric compression element 132 between the matching circuitized flexible substrate 136 and reference plate 134 to create non-wiping contact between the electrical contacts 51 of the portable cartridge substrate 50 and the electrical contacts 141 of the matching circuitized flexible substrate 136, thereby forming a releasable, repeatable electrical connection therebetween.

As an example, the force generated by the loader may comprise at least 30 grams per compression member, for a total normal force greater than 10 pounds on the cartridge, and compresses the compression element a depth of about 0.022 inches. In loading the cartridge, the motor 180 rotates bell crank 182 beyond the center of rotation to a stop, at an over-center position, so that the arm tends to be locked in position to prevent inadvertent release of the cartridge. The motor releases the cartridge by rotating back over center and then towards the front opening 120 of the transfer station. Referring to FIGS. 19 and 20, in one embodiment, bell crank 182 is rotated beyond the center of rotation to a stop 193. In an alternative embodiment, bell crank 182 is rotated until beam 184 contacts the pivot end of bell crank 182, such that beam 184 becomes a stop. When against the stop, the bell crank 182 is locked under pressure, providing the normal force to compress the compression element 132.

Figure 13:
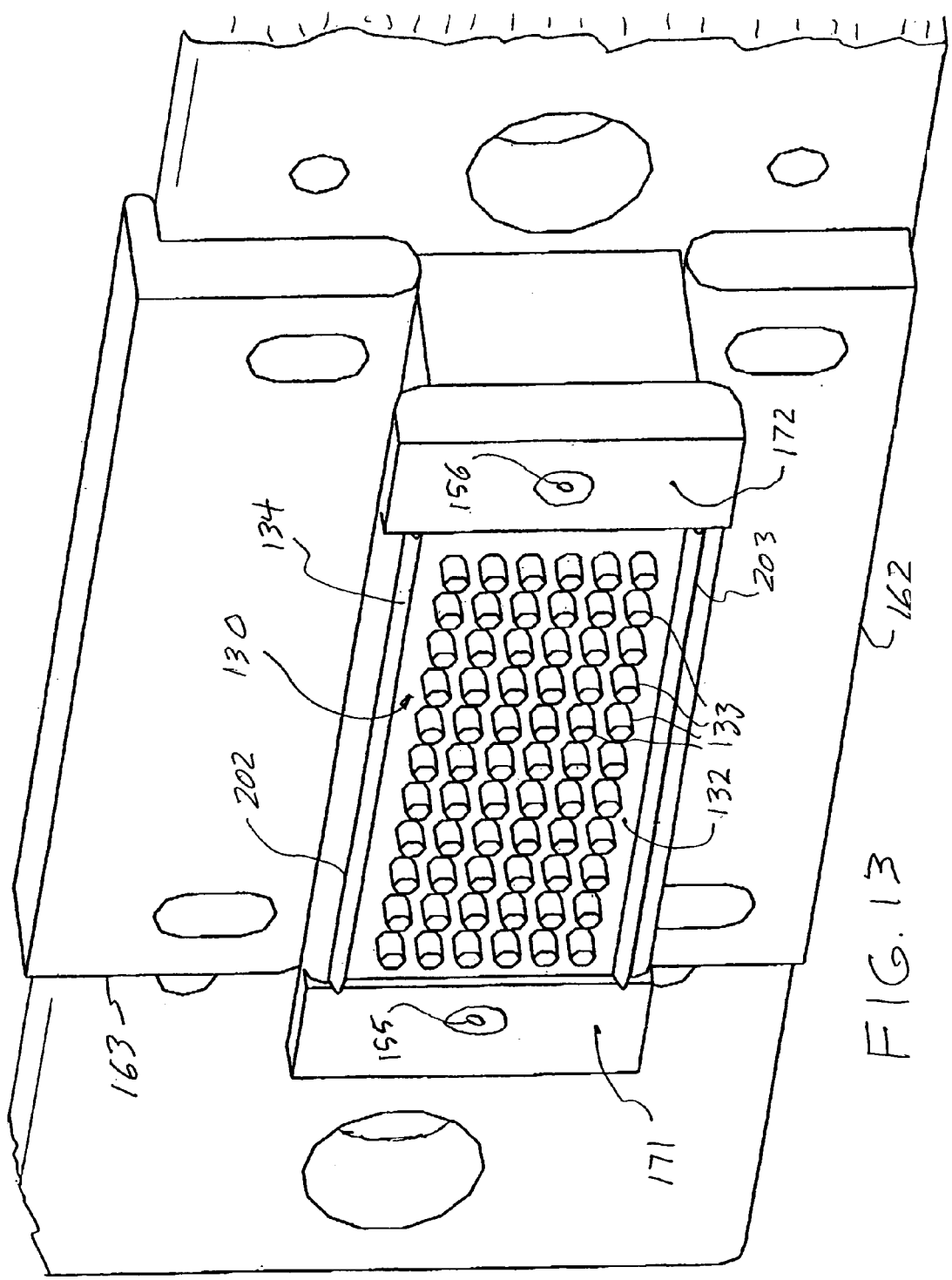
FIG. 13 is an isometric illustration of a compression member, reference plate, support member and clamps of the transfer station of FIG. 9.
Figure 14:
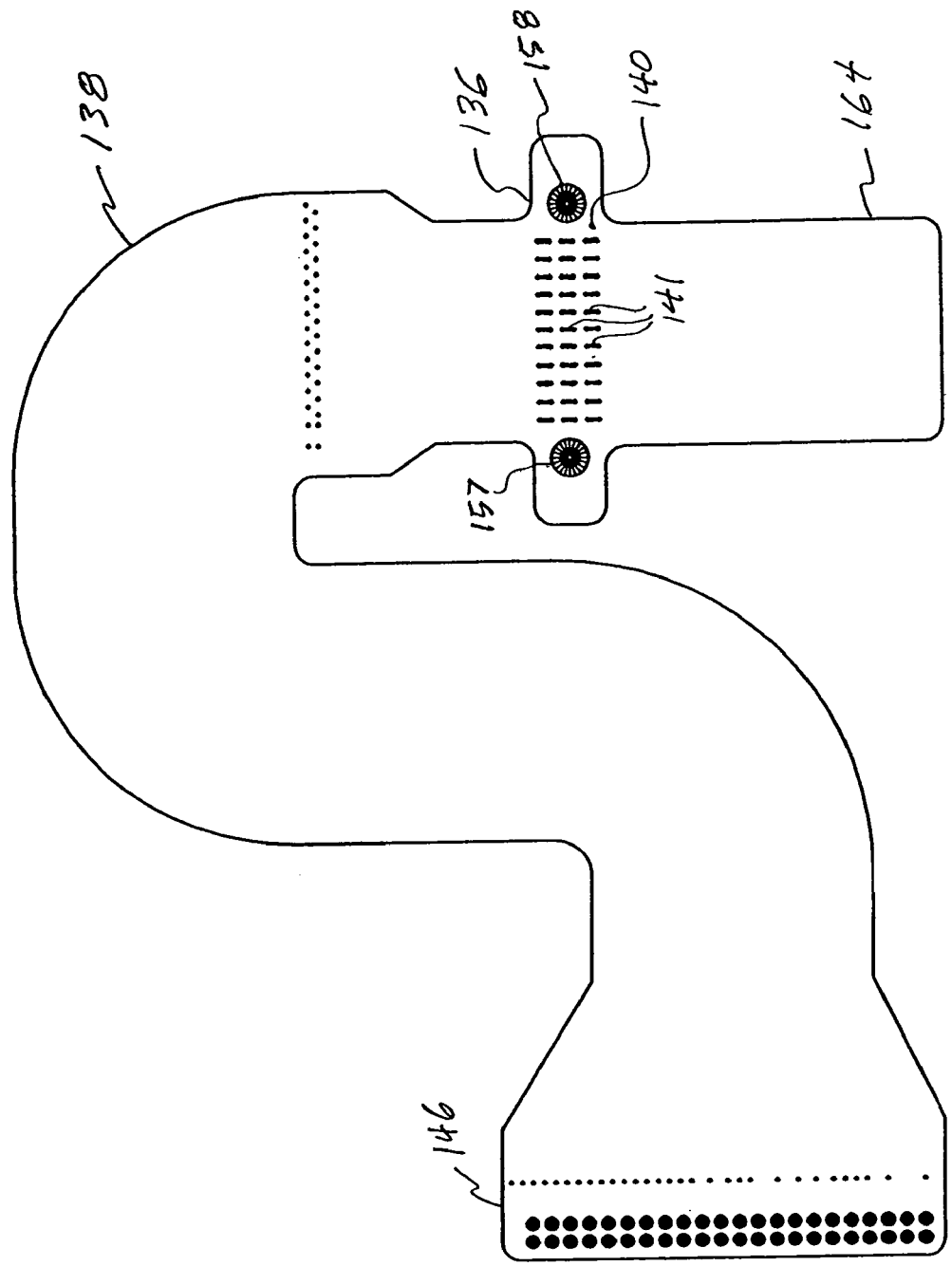
FIG. 14 is a plan view illustration of a flex cable of the transfer station of FIG. 9.

Referring to FIGS. 13 and 18, ribs 202 and 203 are provided at the edges of the compression element 132 to lightly clamp the flex cable substrate 136 of FIG. 14 to help restrain any lateral movement of the flex cable substrate as the individual compression members are compressed under the contacts 141 of the interface.

Surface 171 and 172 straddle the flex cable substrate 136 and butt up to the "H" beam 70 of the cartridge of FIG. 6 or the interface 48 of the cartridge of FIG. 1, and limit the compression of the compression members along the outer rows as the motor 180 of FIG. 10 rotates bell crank 182 to the loaded position.

Figure 21:
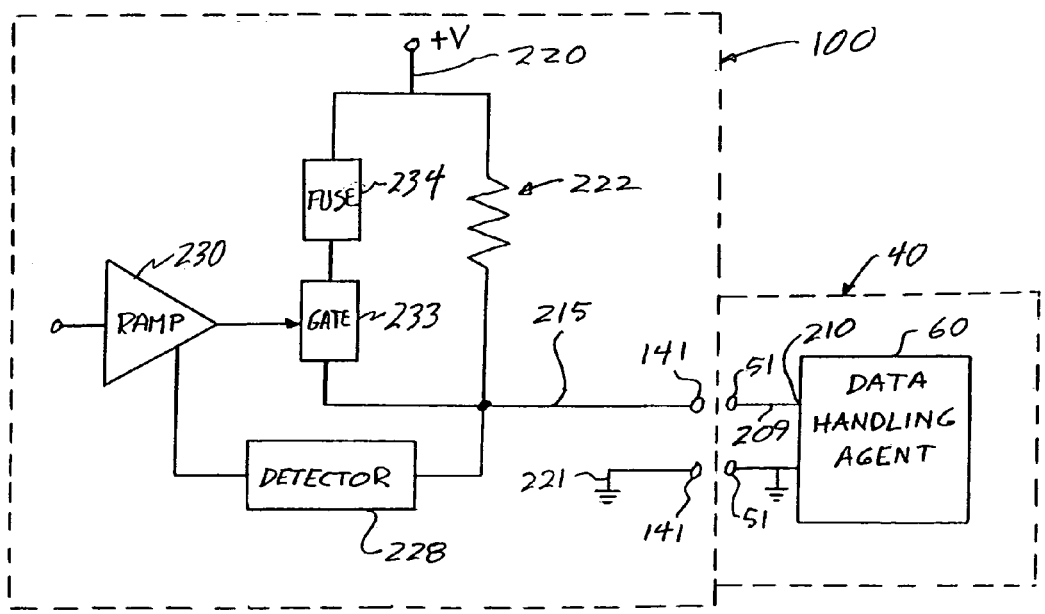
FIG. 21 is a circuit diagram illustrating a power transfer interface of the transfer station of FIG. 9 and of a portable data storage cartridge of FIG. 1.

In another aspect, additionally referring to FIG. 21, the external data transfer interface electrical connector 48 of the portable data storage cartridge 40, in addition to coupling with the data handling agent, or data storage device, such as magnetic data storage drive 60, to provide data transfer with the contacted transfer station 100, comprises a power transfer interface coupled by one or more lands 209 of the flex cable to a power input 210 of the data handling agent to transfer power from the transfer station 100 to the data handling agent.

In a further aspect, the power transfer interface additionally both verifies electrical contact between the data handling agent and the transfer station before supplying full power, and when applying power, gradually ramps the application of power.

Specifically, a transfer station power supply provides power at input 220 for the cartridge 40. A trickle circuit 222 limits current flow to output 215, and to the data handling agent when electrical contact is first made between contacts 141 of the transfer station 100 and contacts 51 of the cartridge 40. Before contact is made, no current flows, and output 215 is at the same voltage as power input 220, which voltage is detected by a detector 228. As soon as contact is made, a small current flows to the data handling agent and back to ground 221, limited by the trickle circuit 222, reducing the voltage at output 215, detected by detector 228. Thus, detector 228 detects the current flow to the cartridge 40, thereby verifying electrical contact between the data handling agent and the transfer station.

Once electrical contact is verified, the detector 228 enables ramping circuit 230 to initially operate gate 233 to gate a small amount of power to output 215, and then gradually ramping gate 233 to ramp up to full power. As the power is ramped up, the voltage at output 215 is increased, and may be detected by detector 228. Thus, optionally, detector 228 may be employed to detect any problems during application of full power evidenced by a change in voltage at output 215, and operate ramping circuit 230 to open gate 233. An example of gate 233 is an FET. Detector 128 also detects "unmating", or release of the cartridge 40 when the electrical contact is unmade, and operates ramping circuit 230 to open gate 233. A fusing circuit 234 may be employed to limit transfer of excessive power to the cartridge 40. The electrical contact verification and the gradual ramping of power insure that the active data handling element or data storage device in the cartridge 40 is protected from electrical spikes which could otherwise damage the device.

Figure 23:
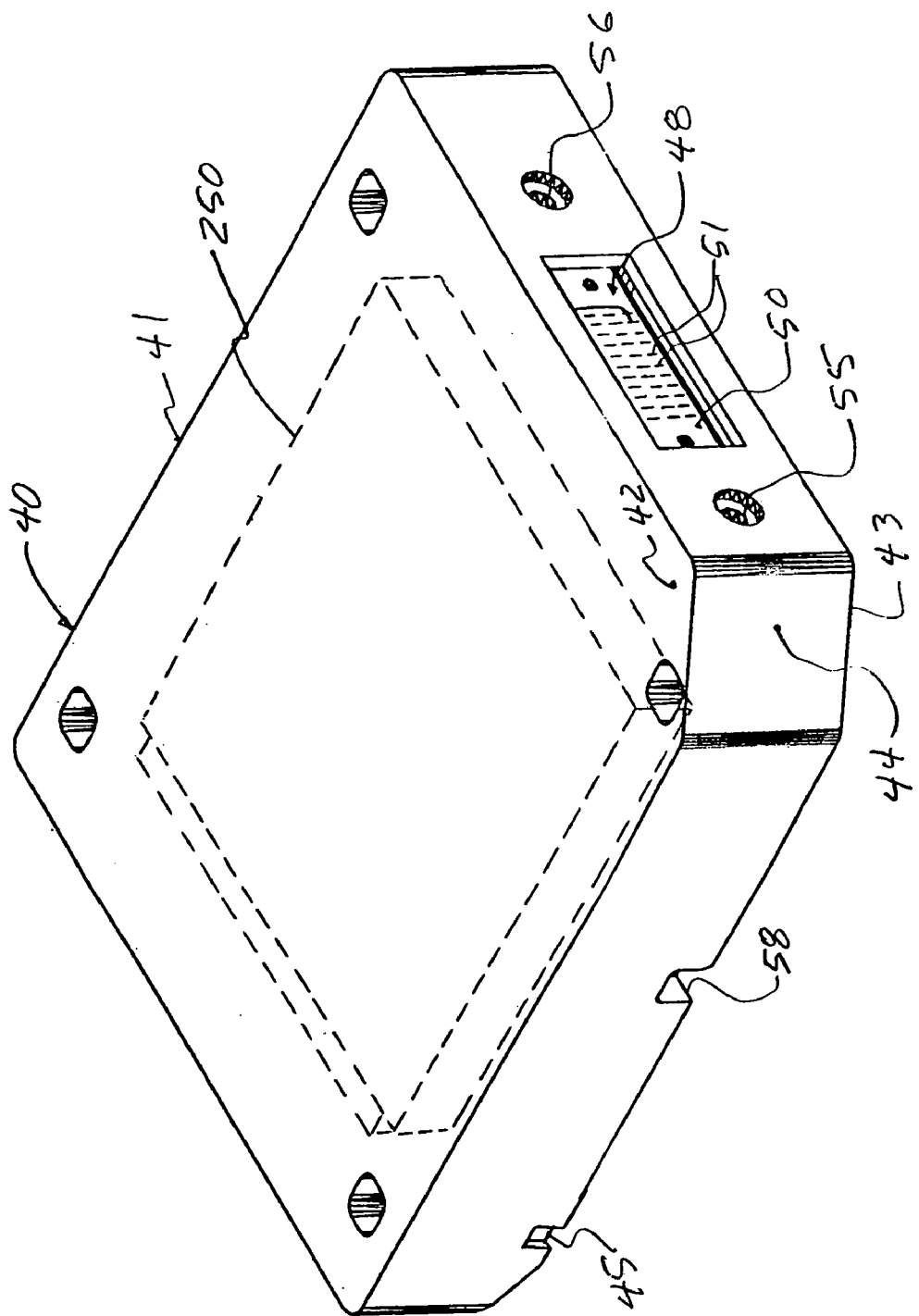
FIG. 23 is a diagrammatic illustration of a portable data storage cartridge of FIG. 1 containing an optical disk drive assembly.

FIGS. 22 and 23 illustrate portable data storage cartridges containing alternative data handling or data storage devices. FIG. 22 illustrates a portable data storage cartridge 40 of FIG. 1 containing a non-volatile solid state memory assembly 240. The solid state memory assembly may advantageously comprise an "off the shelf" device, such as are readily available. FIG. 23 illustrates a portable data storage cartridge of FIG. 1 containing an optical disk drive assembly 250. Currently, commercially available optical disk drives would have to be modified to employ a non-removable optical disk. Other data handling devices may occur to those of skill in the art.

While the preferred embodiments of the present invention have been illustrated in detail, it should be apparent that modifications and adaptations to those embodiments may occur to one skilled in the art without departing from the scope of the present invention as set forth in the following claims.

We claim:

1. An automated data storage library, comprising:
   storage shelves for storing portable data storage cartridges;
   at least one robot accessor having a gripper, said robot accessor for gripping and transporting at least one selected said portable data storage cartridge with respect to said storage shelves; and
   a transfer station for releasably, repeatably electrically coupling with respect to a substrate having a plurality of electrical contacts on a substantially flat facing surface thereof, said substrate mounted in said portable data storage cartridge capable of being engaged by a loader, comprising:
   a matching circuitized flexible substrate having electrical contacts on a facing surface thereof, said electrical contacts arranged to match said portable cartridge electrical contacts when in a face-to-face relationship;
   an elastomeric compression element having a plurality of protruding compression members positioned at a rear surface of said matching circuitized flexible substrate and said protruding compression members facing and in contact with said rear surface, individual said compression members registered with corresponding individual said electrical contacts;
   a reference plate for supporting said elastomeric compression element; and
   a loader for engaging said portable data storage cartridge as received from said robot accessor, registering said cartridge substrate electrical contacts in face-to-face relation with said matching circuitized flexible substrate electrical contacts, and exerting a force on said portable cartridge toward said facing surface of said matching circuitized flexible substrate to cause said portable cartridge substrate to compress said elastomeric compression element between said matching circuitized flexible substrate and said reference plate to create non-wiping contact between said electrical contacts of said portable cartridge substrate and said electrical contacts of said matching circuitized flexible substrate, thereby forming a releasable, repeatable electrical connection therebetween.

2. The automated data storage library of claim 1, wherein said electrical contacts of said transfer station matching circuitized flexible substrate comprise pads containing gold.

3. The automated data storage library of claim 2, wherein said transfer station matching circuitized flexible substrate comprises copper pads on which are plated a diffusion barrier, and Type II gold pads plated on said diffusion barrier.

4. The automated data storage library of claim 3, wherein said transfer station gold pads are plated to a thickness greater than standard.

5. The automated data storage library of claim 1, wherein said electrical contacts of said transfer station matching circuitized flexible substrate comprise pads containing palladium.

6. The automated data storage library of claim 1, wherein said transfer station loader is arranged to provide said force on said portable cartridge toward said facing surface of said matching circuitized flexible substrate, as a force normal to said facing surface of said matching circuitized flexible substrate.

7. The automated data storage library of claim 6, wherein said transfer station loader is arranged to provide said normal force in the amount of at least 30 grams per individual compression member.

8. The automated data storage library of claim 1, wherein at least ones of said electrical contacts of said transfer station matching circuitized flexible substrate comprise elongated contacts, each registering with two adjacent said individual compression members of said elastomeric compression element.

9. The automated data storage library of claim 1, wherein said transfer station reference plate is substantially flat, providing substantially uniform support of said elastomeric compression element.

10. The automated data storage library of claim 1, wherein said transfer station additionally comprises alignment pins in close proximity to said elastomeric compression element, said alignment pins aligned substantially normal to said facing surface of said matching circuitized flexible substrate for mating with corresponding alignment holes of said portable cartridge to laterally align said portable cartridge substrate and said matching circuitized flexible substrate.

11. The automated data storage library of claim 10, wherein said transfer station alignment pins are tapered to a rounded point in the direction of said portable cartridge substrate to orient said portable cartridge substrate and gradually laterally align said portable cartridge substrate and said matching circuitized flexible substrate.

12. The automated data storage library of claim 10, wherein said transfer station alignment pins extend beyond said matching circuitized flexible substrate a distance sufficient to contact a cartridge failing to have said alignment holes, to protect said matching circuitized flexible substrate from contact with said cartridge.

13. The automated data storage library of claim 10, wherein said transfer station alignment pins are conductive and coupled to ground to discharge any electrostatic charge at said corresponding alignment holes of said portable cartridge.

14. The automated data storage library of claim 1, wherein said transfer station facing surface of said matching circuitized flexible substrate is oriented parallel to gravity, and said transfer station loader is oriented to provide said force orthogonal to gravity, to minimize debris deposition on said facing surface.

15. The automated data storage library of claim 1, wherein said transfer station matching circuitized flexible substrate comprises a termination of a flex cable.

16. The automated data storage library of claim 15, wherein said transfer station flex cable issues from said elastomeric compression element without an immediate change in direction, and subsequently forming a gradual curve in said normal direction to maintain symmetrical force on said matching circuitized flexible substrate as said elastomeric compression element is compressed.

17. The automated data storage library of claim 1, wherein said electrical contacts of said transfer station matching circuitized flexible substrate are substantially flat.

18. The automated data storage library of claim 1, wherein said electrical contacts of said transfer station matching circuitized flexible substrate comprise shaped contacts.

19. The automated data storage library of claim 1, wherein said transfer station loader comprises at least one bell crank which rotates to an overcenter position, thereby exerting said force on said portable cartridge.

* * * * *